(12) United States Patent
Yu et al.

(10) Patent No.: US 12,062,538 B2
(45) Date of Patent: Aug. 13, 2024

(54) ATOMIC LAYER ETCH AND SELECTIVE DEPOSITION PROCESS FOR EXTREME ULTRAVIOLET LITHOGRAPHY RESIST IMPROVEMENT

(71) Applicant: Lam Research Corporation, Fremont, CA (US)

(72) Inventors: Jengyi Yu, San Ramon, CA (US); Samantha S. H. Tan, Newark, CA (US); Liu Yang, Seattle, WA (US); Chen-Wei Liang, El Cerrito, CA (US); Boris Volosskiy, San Jose, CA (US); Richard Wise, Los Gatos, CA (US); Yang Pan, Los Altos, CA (US); Da Li, Newark, CA (US); Ge Yuan, New Haven, CT (US); Andrew Liang, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 256 days.

(21) Appl. No.: 17/594,744

(22) PCT Filed: Apr. 14, 2020

(86) PCT No.: PCT/US2020/028151
§ 371 (c)(1),
(2) Date: Oct. 28, 2021

(87) PCT Pub. No.: WO2020/223011
PCT Pub. Date: Nov. 5, 2020

(65) Prior Publication Data
US 2022/0216050 A1    Jul. 7, 2022

Related U.S. Application Data

(60) Provisional application No. 62/840,687, filed on Apr. 30, 2019.

(51) Int. Cl.
*H01L 21/02* (2006.01)

(52) U.S. Cl.
CPC .... *H01L 21/0228* (2013.01); *H01L 21/02164* (2013.01); *H01L 21/02211* (2013.01); *H01L 21/02274* (2013.01)

(58) Field of Classification Search
CPC .......... H01L 21/0228; H01L 21/02164; H01L 21/02211; H01L 21/02274;
(Continued)

(56) References Cited

U.S. PATENT DOCUMENTS

| 3,442,648 A | 5/1969 | Smith et al. |
| 3,513,010 A | 5/1970 | Notley et al. |

(Continued)

FOREIGN PATENT DOCUMENTS

| CN | 1904727 A | 1/2007 |
| CN | 102610516 A | 7/2012 |

(Continued)

OTHER PUBLICATIONS

Chinese First Office Action dated May 24, 2017 issued in Application No. CN 201510053668.7.
(Continued)

*Primary Examiner* — Duy Vu N Deo
(74) *Attorney, Agent, or Firm* — Weaver Austin Villeneuve & Sampson LLP

(57) ABSTRACT

Provided herein are methods and systems for reducing roughness of an EUV resist and improving etched features. The methods involve descumming an EUV resist, filling divots of the EUV resist, and protecting EUV resists with a cap. The resulting EUV resist has smoother features and increased selectivity to an underlying layer, which improves the quality of etched features. Following etching of the underlying layer, the cap may be removed.

32 Claims, 13 Drawing Sheets

(58) Field of Classification Search
CPC ......... H01L 21/31122; H01L 21/31144; H01L 21/02115; H01L 21/32; H01L 21/32105; H01L 21/0332; H01L 21/31138; H01L 21/0273; H01L 21/0337; H01L 21/02057; H01L 21/02172; H01L 21/0223; H01L 21/31116

USPC .................................................. 438/689–714

See application file for complete search history.

(56) References Cited

U.S. PATENT DOCUMENTS

| | | |
|---|---|---|
| 3,529,963 A | 9/1970 | Marchese et al. |
| 3,576,755 A | 4/1971 | Patella et al. |
| 3,720,515 A | 3/1973 | Stanley |
| 4,241,165 A | 12/1980 | Hughes et al. |
| 4,328,298 A | 5/1982 | Nester |
| 4,341,592 A | 7/1982 | Shortes et al. |
| 4,590,149 A | 5/1986 | Nakane et al. |
| 4,738,748 A | 4/1988 | Kisa |
| 4,806,456 A | 2/1989 | Katoh |
| 4,834,834 A | 5/1989 | Ehrlich et al. |
| 4,842,989 A | 6/1989 | Taniguchi et al. |
| 4,845,053 A | 7/1989 | Zajac |
| 4,940,854 A | 7/1990 | Debe |
| 5,077,085 A | 12/1991 | Schnur et al. |
| 5,322,765 A | 6/1994 | Clecak et al. |
| 5,445,988 A | 8/1995 | Schwalke |
| 5,534,312 A | 7/1996 | Hill et al. |
| 5,914,278 A | 6/1999 | Boitnott et al. |
| 5,925,494 A | 7/1999 | Horn |
| 6,017,553 A | 1/2000 | Burrell et al. |
| 6,045,877 A | 4/2000 | Gleason et al. |
| 6,162,577 A | 12/2000 | Felter et al. |
| 6,179,922 B1 | 1/2001 | Ishikawa et al. |
| 6,261,938 B1 | 7/2001 | Beauvais et al. |
| 6,290,779 B1 | 9/2001 | Saleh et al. |
| 6,348,239 B1 | 2/2002 | Hill et al. |
| 6,448,097 B1 | 9/2002 | Singh et al. |
| 6,573,030 B1 | 6/2003 | Fairbairn et al. |
| 6,607,867 B1 | 8/2003 | Kim et al. |
| 6,797,439 B1 | 9/2004 | Alpay |
| 6,841,341 B2 | 1/2005 | Fairbairn et al. |
| 6,841,943 B2 | 1/2005 | Vahedi et al. |
| 7,169,440 B2 | 1/2007 | Balasubramaniam et al. |
| 7,223,526 B2 | 5/2007 | Fairbairn et al. |
| 7,307,695 B2 | 12/2007 | Hazenberg et al. |
| 7,335,462 B2 | 2/2008 | Fairbairn et al. |
| 7,608,367 B1 | 10/2009 | Aigeldinger et al. |
| 8,465,903 B2 | 6/2013 | Weidman et al. |
| 8,536,068 B2 | 9/2013 | Weidman et al. |
| 8,552,334 B2 | 10/2013 | Tappan et al. |
| 8,664,124 B2 | 3/2014 | Graff |
| 8,664,513 B2 | 3/2014 | Pfenninger et al. |
| 8,703,386 B2 | 4/2014 | Bass et al. |
| 8,808,561 B2 | 8/2014 | Kanarik |
| 8,883,028 B2 | 11/2014 | Kanarik |
| 8,883,405 B2 | 11/2014 | Shiobara |
| 9,023,731 B2 | 5/2015 | Ji et al. |
| 9,261,784 B2 | 2/2016 | Wuister et al. |
| 9,310,684 B2 | 4/2016 | Meyers et al. |
| 9,551,924 B2 | 1/2017 | Burkhardt et al. |
| 9,576,811 B2 | 2/2017 | Kanarik et al. |
| 9,632,411 B2 | 4/2017 | Michaelson et al. |
| 9,778,561 B2 | 10/2017 | Marks et al. |
| 9,823,564 B2 | 11/2017 | Stowers et al. |
| 9,996,004 B2 | 6/2018 | Smith et al. |
| 10,025,179 B2 | 7/2018 | Meyers et al. |
| 10,228,618 B2 | 3/2019 | Meyers et al. |
| 10,416,554 B2 | 9/2019 | Meyers et al. |
| 10,514,598 B2 | 12/2019 | Marks et al. |
| 10,580,585 B2 | 3/2020 | Snaith et al. |
| 10,627,719 B2 | 4/2020 | Waller et al. |
| 10,642,153 B2 | 5/2020 | Meyers et al. |
| 10,649,328 B2 | 5/2020 | Stowers et al. |
| 10,732,505 B1 | 8/2020 | Meyers et al. |
| 10,775,696 B2 | 9/2020 | Meyers et al. |
| 10,782,610 B2 | 9/2020 | Stowers et al. |
| 10,787,466 B2 | 9/2020 | Edson et al. |
| 10,796,912 B2 | 10/2020 | Shamma et al. |
| 10,831,096 B2 | 11/2020 | Marks et al. |
| 11,209,729 B2 | 12/2021 | Marks et al. |
| 11,257,674 B2 | 2/2022 | Shamma et al. |
| 11,314,168 B2 | 4/2022 | Tan et al. |
| 11,705,332 B2 | 7/2023 | Kuo et al. |
| 2001/0024769 A1 | 9/2001 | Donoghue et al. |
| 2002/0017243 A1 | 2/2002 | Pyo |
| 2002/0180372 A1 | 12/2002 | Yamazaki |
| 2003/0008246 A1 | 1/2003 | Cheng et al. |
| 2003/0183244 A1 | 10/2003 | Rossman |
| 2004/0113087 A1 | 6/2004 | Ikeda et al. |
| 2004/0175631 A1 | 9/2004 | Crocker et al. |
| 2004/0191423 A1 | 9/2004 | Ruan et al. |
| 2004/0213563 A1 | 10/2004 | Irie |
| 2005/0167617 A1 | 8/2005 | Derra et al. |
| 2005/0208389 A1 | 9/2005 | Ishibashi et al. |
| 2005/0253077 A1 | 11/2005 | Ikeda et al. |
| 2006/0001064 A1 | 1/2006 | Hill et al. |
| 2006/0068173 A1 | 3/2006 | Kajiyama et al. |
| 2006/0147818 A1 | 7/2006 | Lee |
| 2006/0151462 A1 | 7/2006 | Lee et al. |
| 2006/0166537 A1 | 7/2006 | Thompson et al. |
| 2006/0172530 A1 | 8/2006 | Cheng et al. |
| 2006/0175558 A1 | 8/2006 | Bakker et al. |
| 2006/0287207 A1 | 12/2006 | Park et al. |
| 2007/0017386 A1 | 1/2007 | Kamei |
| 2007/0037410 A1 | 2/2007 | Chang et al. |
| 2007/0074541 A1 | 4/2007 | Badding et al. |
| 2007/0117040 A1 | 5/2007 | Brock et al. |
| 2007/0181816 A1 | 8/2007 | Ikeda et al. |
| 2007/0212889 A1 | 9/2007 | Abatchev et al. |
| 2007/0287073 A1 | 12/2007 | Goodwin |
| 2008/0070128 A1 | 3/2008 | Wu et al. |
| 2008/0157011 A1 | 7/2008 | Nagai et al. |
| 2009/0153826 A1 | 6/2009 | Sewell et al. |
| 2009/0197086 A1 | 8/2009 | Rathi et al. |
| 2009/0208880 A1 | 8/2009 | Nemani et al. |
| 2009/0239155 A1 | 9/2009 | Levinson et al. |
| 2009/0286402 A1 | 11/2009 | Xia et al. |
| 2009/0305174 A1 | 12/2009 | Shiobara et al. |
| 2009/0317742 A1 | 12/2009 | Toriumi et al. |
| 2009/0321707 A1 | 12/2009 | Metz et al. |
| 2009/0325387 A1 | 12/2009 | Chen et al. |
| 2010/0022078 A1 | 1/2010 | Rockenberger et al. |
| 2010/0131093 A1 | 5/2010 | Yokoyama et al. |
| 2010/0197135 A1 | 8/2010 | Ishizaka |
| 2010/0266969 A1 | 10/2010 | Shiraishi et al. |
| 2010/0297847 A1 | 11/2010 | Cheng et al. |
| 2010/0304027 A1 | 12/2010 | Lee et al. |
| 2010/0310790 A1 | 12/2010 | Chang et al. |
| 2011/0059617 A1 | 3/2011 | Mitchell et al. |
| 2011/0104595 A1 | 5/2011 | Hayashi et al. |
| 2011/0198756 A1 | 8/2011 | Thenappan et al. |
| 2011/0209725 A1 | 9/2011 | Kim et al. |
| 2012/0068347 A1 | 3/2012 | Isobayashi et al. |
| 2012/0088193 A1 | 4/2012 | Weidman et al. |
| 2012/0088369 A1 | 4/2012 | Weidman et al. |
| 2012/0090547 A1 | 4/2012 | Wang et al. |
| 2012/0126358 A1 | 5/2012 | Arnold et al. |
| 2012/0193762 A1 | 8/2012 | Lin et al. |
| 2012/0202357 A1 | 8/2012 | Sato et al. |
| 2012/0208125 A1 | 8/2012 | Hatakeyama |
| 2012/0223418 A1 | 9/2012 | Stowers et al. |
| 2012/0322011 A1 | 12/2012 | Wu et al. |
| 2013/0023124 A1 | 1/2013 | Nemani et al. |
| 2013/0109186 A1 | 5/2013 | Zhang et al. |
| 2013/0129995 A1 | 5/2013 | Ouattara et al. |
| 2013/0157177 A1 | 6/2013 | Yu et al. |
| 2013/0177847 A1 | 7/2013 | Chatterjee et al. |
| 2013/0224652 A1 | 8/2013 | Bass et al. |
| 2013/0330928 A1 | 12/2013 | Ishikawa et al. |
| 2013/0330932 A1 | 12/2013 | Rangarajan et al. |
| 2014/0014745 A1 | 1/2014 | Burrows et al. |
| 2014/0120688 A1 | 5/2014 | Booth, Jr. et al. |

(56) References Cited

U.S. PATENT DOCUMENTS

| | | |
|---|---|---|
| 2014/0134827 A1 | 5/2014 | Swaminathan et al. |
| 2014/0170563 A1 | 6/2014 | Hatakeyama |
| 2014/0170853 A1 | 6/2014 | Shamma et al. |
| 2014/0175617 A1 | 6/2014 | Antonelli et al. |
| 2014/0193580 A1 | 7/2014 | Tiron et al. |
| 2014/0209015 A1 | 7/2014 | Yamada et al. |
| 2014/0220489 A1 | 8/2014 | Kozuma et al. |
| 2014/0239462 A1 | 8/2014 | Shamma et al. |
| 2014/0268082 A1 | 9/2014 | Michaelson et al. |
| 2014/0272726 A1 | 9/2014 | Chang |
| 2015/0041809 A1 | 2/2015 | Arnold et al. |
| 2015/0056542 A1 | 2/2015 | Meyers et al. |
| 2015/0077733 A1 | 3/2015 | Huang et al. |
| 2015/0079393 A1 | 3/2015 | Freedman et al. |
| 2015/0125679 A1 | 5/2015 | Ishikawa |
| 2015/0132965 A1 | 5/2015 | Devilliers et al. |
| 2015/0152551 A1 | 6/2015 | Yamaguchi et al. |
| 2015/0170957 A1 | 6/2015 | Tsao |
| 2015/0194343 A1 | 7/2015 | Chi et al. |
| 2015/0217330 A1 | 8/2015 | Haukka et al. |
| 2015/0221519 A1 | 8/2015 | Marks et al. |
| 2015/0243520 A1 | 8/2015 | Park et al. |
| 2015/0303064 A1 | 10/2015 | Singer et al. |
| 2015/0332922 A1 | 11/2015 | Chien et al. |
| 2016/0011505 A1 | 1/2016 | Stowers et al. |
| 2016/0011516 A1 | 1/2016 | Devilliers |
| 2016/0035631 A1 | 2/2016 | Lee et al. |
| 2016/0086864 A1 | 3/2016 | Fischer et al. |
| 2016/0116839 A1 | 4/2016 | Meyers et al. |
| 2016/0118246 A1 | 4/2016 | Kang et al. |
| 2016/0135274 A1 | 5/2016 | Fischer et al. |
| 2016/0179005 A1 | 6/2016 | Shamma et al. |
| 2016/0216606 A1 | 7/2016 | Meyers et al. |
| 2016/0284559 A1 | 9/2016 | Kikuchi et al. |
| 2016/0293405 A1 | 10/2016 | Matsumoto et al. |
| 2016/0314964 A1 | 10/2016 | Tang et al. |
| 2016/0357107 A1 | 12/2016 | Buchberger, Jr. et al. |
| 2016/0365248 A1* | 12/2016 | Mebarki ............ H01L 21/02118 |
| 2016/0379824 A1 | 12/2016 | Wise et al. |
| 2017/0010535 A1 | 1/2017 | Fujitani et al. |
| 2017/0069462 A1 | 3/2017 | Kanarik et al. |
| 2017/0102612 A1 | 4/2017 | Meyers et al. |
| 2017/0146909 A1 | 5/2017 | Smith et al. |
| 2017/0154766 A1 | 6/2017 | Ogihara et al. |
| 2017/0168398 A1 | 6/2017 | Zi et al. |
| 2017/0176858 A1 | 6/2017 | Hirano |
| 2017/0184961 A1 | 6/2017 | Nakagawa et al. |
| 2017/0192357 A1 | 7/2017 | Carcasi et al. |
| 2017/0261850 A1 | 9/2017 | Stowers et al. |
| 2018/0004083 A1 | 1/2018 | Marks et al. |
| 2018/0012759 A1 | 1/2018 | Smith et al. |
| 2018/0039172 A1 | 2/2018 | Stowers et al. |
| 2018/0039182 A1 | 2/2018 | Zi et al. |
| 2018/0046086 A1 | 2/2018 | Waller et al. |
| 2018/0061663 A1 | 3/2018 | Chandrashekar et al. |
| 2018/0122648 A1 | 5/2018 | Kim et al. |
| 2018/0151350 A1 | 5/2018 | Li |
| 2018/0166278 A1 | 6/2018 | Belyansky et al. |
| 2018/0224744 A1 | 8/2018 | Bae et al. |
| 2018/0233362 A1 | 8/2018 | Glodde et al. |
| 2018/0307137 A1 | 10/2018 | Meyers et al. |
| 2018/0308687 A1 | 10/2018 | Smith et al. |
| 2018/0314167 A1 | 11/2018 | Chang et al. |
| 2018/0337046 A1 | 11/2018 | Shamma et al. |
| 2018/0350879 A1* | 12/2018 | Sel ..................... H01L 21/76831 |
| 2018/0354804 A1 | 12/2018 | Venkatasubramanian et al. |
| 2019/0027357 A1 | 1/2019 | Girard et al. |
| 2019/0043731 A1 | 2/2019 | Bristol et al. |
| 2019/0094175 A1* | 3/2019 | Merriman .......... G01N 27/4145 |
| 2019/0094685 A1 | 3/2019 | Marks et al. |
| 2019/0115206 A1 | 4/2019 | Kim et al. |
| 2019/0129307 A1 | 5/2019 | Kwon et al. |
| 2019/0137870 A1 | 5/2019 | Meyers et al. |
| 2019/0153001 A1 | 5/2019 | Cardineau et al. |
| 2019/0163056 A1 | 5/2019 | Maes et al. |
| 2019/0172714 A1 | 6/2019 | Bobek et al. |
| 2019/0187556 A1 | 6/2019 | Park et al. |
| 2019/0198338 A1 | 6/2019 | Kim et al. |
| 2019/0244809 A1 | 8/2019 | Ono |
| 2019/0259601 A1 | 8/2019 | De Silva et al. |
| 2019/0308998 A1 | 10/2019 | Cardineau et al. |
| 2019/0315781 A1 | 10/2019 | Edson et al. |
| 2019/0315782 A1 | 10/2019 | Edson et al. |
| 2019/0332014 A1 | 10/2019 | Ookubo et al. |
| 2019/0333777 A1 | 10/2019 | Hsieh et al. |
| 2019/0341256 A1 | 11/2019 | Shankar et al. |
| 2019/0348292 A1 | 11/2019 | Dutta et al. |
| 2019/0352776 A1 | 11/2019 | Parikh |
| 2019/0369489 A1 | 12/2019 | Meyers et al. |
| 2019/0391486 A1 | 12/2019 | Jiang et al. |
| 2019/0393035 A1 | 12/2019 | O'Meara et al. |
| 2020/0051781 A1* | 2/2020 | Fujimura ................. G06N 3/10 |
| 2020/0064733 A1 | 2/2020 | Meyers et al. |
| 2020/0066536 A1 | 2/2020 | Yaegashi |
| 2020/0089104 A1 | 3/2020 | Marks et al. |
| 2020/0124970 A1 | 4/2020 | Kocsis et al. |
| 2020/0174374 A1 | 6/2020 | Liao et al. |
| 2020/0176246 A1 | 6/2020 | Huotari et al. |
| 2020/0209756 A1 | 7/2020 | Waller et al. |
| 2020/0239498 A1 | 7/2020 | Clark et al. |
| 2020/0241413 A1 | 7/2020 | Clark et al. |
| 2020/0257196 A1 | 8/2020 | Meyers et al. |
| 2020/0292937 A1 | 9/2020 | Stowers et al. |
| 2020/0393765 A1 | 12/2020 | Sakanishi |
| 2021/0013034 A1 | 1/2021 | Wu et al. |
| 2021/0397085 A1 | 12/2021 | Weidman et al. |
| 2022/0020584 A1 | 1/2022 | Volosskiy et al. |
| 2022/0035247 A1 | 2/2022 | Tan et al. |
| 2022/0043334 A1 | 2/2022 | Tan et al. |
| 2022/0075260 A1 | 3/2022 | Marks et al. |
| 2022/0122846 A1 | 4/2022 | Shamma et al. |
| 2022/0157617 A1 | 5/2022 | Zhou et al. |
| 2022/0244645 A1 | 8/2022 | Tan et al. |
| 2022/0299877 A1 | 9/2022 | Weidman et al. |
| 2022/0308454 A1 | 9/2022 | Weidman et al. |
| 2022/0308462 A1 | 9/2022 | Berney et al. |
| 2022/0342301 A1 | 10/2022 | Weidman et al. |
| 2022/0344136 A1 | 10/2022 | Peter et al. |
| 2022/0365434 A1 | 11/2022 | Nardi et al. |
| 2023/0031955 A1 | 2/2023 | Yu et al. |
| 2023/0045336 A1 | 2/2023 | Yu et al. |
| 2023/0107357 A1 | 4/2023 | Dictus et al. |
| 2023/0185196 A1 | 6/2023 | Weidman et al. |
| 2023/0259025 A1 | 8/2023 | Hansen et al. |
| 2023/0266662 A1 | 8/2023 | Marks et al. |
| 2023/0266664 A1 | 8/2023 | Hansen et al. |
| 2023/0266670 A1 | 8/2023 | Hansen et al. |
| 2023/0273516 A1 | 8/2023 | Marks et al. |
| 2023/0288798 A1 | 9/2023 | Hansen et al. |
| 2023/0314946 A1 | 10/2023 | Hansen et al. |
| 2023/0343593 A1 | 10/2023 | Nagabhirava et al. |

FOREIGN PATENT DOCUMENTS

| | | |
|---|---|---|
| CN | 103119695 A | 5/2013 |
| CN | 103243310 A | 8/2013 |
| CN | 105579906 A | 5/2016 |
| CN | 106876251 A | 6/2017 |
| CN | 108351586 A | 7/2018 |
| CN | 108351594 A | 7/2018 |
| CN | 108388079 A | 8/2018 |
| CN | 109521657 A | 3/2019 |
| CN | 109976097 A | 7/2019 |
| CN | 111258190 A | 6/2020 |
| EP | 1123423 B1 | 8/2007 |
| EP | 2256789 A1 | 12/2010 |
| EP | 2608247 A1 | 6/2013 |
| EP | 3230294 A1 | 10/2017 |
| EP | 3258317 A1 | 12/2017 |
| JP | H07106224 A | 4/1995 |
| JP | H08339950 A | 12/1996 |
| JP | H10209133 A | 8/1998 |
| JP | 2003213001 A | 7/2003 |
| JP | 2003532303 A | 10/2003 |

(56) References Cited

FOREIGN PATENT DOCUMENTS

| | | |
|---|---|---|
| JP | 2004006798 A | 1/2004 |
| JP | 2005504146 A | 2/2005 |
| JP | 2006253282 A | 9/2006 |
| JP | 2009192350 A | 8/2009 |
| JP | 2010016083 A | 1/2010 |
| JP | 2010016314 A | 1/2010 |
| JP | 2010531931 A | 9/2010 |
| JP | 2010239087 A | 10/2010 |
| JP | 2011520242 A | 7/2011 |
| JP | 2011529126 A | 12/2011 |
| JP | 2012142481 A | 7/2012 |
| JP | 2012173315 A | 9/2012 |
| JP | 2012185485 A | 9/2012 |
| JP | 5055743 B2 | 10/2012 |
| JP | 2013096011 A | 5/2013 |
| JP | 2013517600 A | 5/2013 |
| JP | 2013526061 A | 6/2013 |
| JP | 2013145874 A | 7/2013 |
| JP | 5544914 B2 | 7/2014 |
| JP | 2014521111 A | 8/2014 |
| JP | 5705103 B2 | 4/2015 |
| JP | 2015201622 A | 11/2015 |
| JP | 2016131238 A | 7/2016 |
| JP | 2016208027 A | 12/2016 |
| JP | 2017045869 A | 3/2017 |
| JP | 2017108053 A | 6/2017 |
| JP | 2018518688 A | 7/2018 |
| JP | 2019500490 A | 1/2019 |
| JP | 2019506730 A | 3/2019 |
| JP | 2019053305 A | 4/2019 |
| JP | 2019135755 A | 8/2019 |
| JP | 2019192814 A | 10/2019 |
| KR | 960000375 B1 | 1/1996 |
| KR | 100841495 B1 | 6/2008 |
| KR | 20090042059 A | 4/2009 |
| KR | 20130093038 A | 8/2013 |
| KR | 20140106442 A | 9/2014 |
| KR | 20170066225 A | 6/2017 |
| KR | 20180054917 A | 5/2018 |
| KR | 20190085654 A | 7/2019 |
| TW | 201224190 A | 6/2012 |
| TW | I365354 B | 6/2012 |
| TW | 201241555 A | 10/2012 |
| TW | I494689 B | 8/2015 |
| TW | 201729006 A | 8/2017 |
| TW | 201734025 A | 10/2017 |
| TW | 201907445 A | 2/2019 |
| WO | WO-03029015 A2 | 4/2003 |
| WO | WO-2004095551 A1 | 11/2004 |
| WO | WO-2007123539 A1 | 11/2007 |
| WO | WO-2011081151 A1 | 7/2011 |
| WO | WO-2011087984 A2 | 7/2011 |
| WO | WO-2011137059 A2 | 11/2011 |
| WO | WO-2012048094 A3 | 7/2012 |
| WO | WO-2013007442 A1 | 1/2013 |
| WO | WO-2014152023 A1 | 9/2014 |
| WO | WO-2016065120 A1 | 4/2016 |
| WO | WO-2016144960 A1 | 9/2016 |
| WO | WO-2017066319 A2 | 4/2017 |
| WO | WO-2017109040 A1 | 6/2017 |
| WO | WO-2017198418 A1 | 11/2017 |
| WO | WO-2018004551 A1 | 1/2018 |
| WO | WO-2018061670 A1 | 4/2018 |
| WO | WO-2019163455 A1 | 8/2019 |
| WO | WO-2019217749 A1 | 11/2019 |
| WO | WO-2019222320 A1 | 11/2019 |
| WO | WO-2019230462 A1 | 12/2019 |
| WO | WO-2019241402 A1 | 12/2019 |
| WO | WO-2020030855 A2 | 2/2020 |
| WO | WO-2020102085 A1 | 5/2020 |
| WO | WO-2020132281 A1 | 6/2020 |
| WO | WO-2020223011 A1 | 11/2020 |
| WO | WO-2020263750 A1 | 12/2020 |
| WO | WO-2020264557 A1 | 12/2020 |
| WO | WO-2021067632 A2 | 4/2021 |
| WO | WO-2021072042 A1 | 4/2021 |

OTHER PUBLICATIONS

Chinese Second Office Action dated Feb. 28, 2018 issued in Application No. CN 201510053668.7.
Coons et al., (2010) "Comparison of EUV spectral and ion emission features from laser-produced Sn and Li plasmas," Extreme Ultraviolet (EUV) Lithography, Proc. Of SPIE, 7636:763636-1 to 763636-7.
Fan, Y. et al., (2016) "Benchmarking Study of EUV Resists for NXE:3300B," Proc. of SPIE, 9776:97760W-1 to 97760W-11 [Downloaded From http://proceedings.spiedigitallibrary.org/ on Mar. 30, 2017].
Fujifilm Corp., (Presentation) "Negative tone development process for double patterning," 5th International Symposium on Immersion Lithography, Sep. 2008, Presentation Slides No. P-1-P-27.
Fujifilm Corp., (Safety Data Sheet) Name of Substance: n-Butyl acetate; Trade Name of Substance: FN-DP001 Ultra Pure Developer, Revision Date: Nov. 25, 2013, MSDS file: 16328_GB_EN_V2.0, pp. 1-9.
Gangnaik, A.S. et al., (Jan. 12, 2017) "New Generation Electron Beam Resists: A Review," Chem. Mater., 29:1898-1917.
Gerritsen et al., (Apr. 1, 1986) "Laser-generated plasma as soft x-ray source," J. Appl. Phys., 59(7):2337-2344.
International Preliminary Report on Patentability dated Nov. 11, 2021, for International Application No. PCT/US2020/028151.
International Preliminary Report on Patentability dated Nov. 28, 2019 issued in Application No. PCT/US2018/032783.
International Preliminary Report on Patentability dated Nov. 7, 2019 issued in Application No. PCT/US2018/028192.
International Preliminary Report on Patentability dated Sep. 30, 2021 issued in Application No. PCT/US2020/023146.
International Search Report and Written Opinion dated Aug. 8, 2018 issued in Application No. PCT/US2018/028192.
International Search Report and Written Opinion dated Jul. 17, 2020 issued in Application No. PCT/US2020/023146.
International Search Report and Written Opinion dated Jul. 31, 2020, in PCT Application No. PCT/US2020/028151.
International Search Report and Written Opinion dated Oct. 16, 2018 issued in Application No. PCT/US2018/032783.
Japanese Decision to Grant dated Feb. 12, 2019 issued in Application No. JP 2015-016254.
Japanese Decision to Grant dated May 3, 2021 issued in Application No. JP 2016-220096.
Japanese First Office Action dated Oct. 30, 2018 issued in Application No. JP 2015-016254.
Japanese First Office Action dated Sep. 15, 2020 issued in Application No. JP 2016-220096.
Korean Decision for Grant dated Sep. 2, 2021 issued in Application No. KR 10-2015-0015184.
Korean First Office Action dated Dec. 22, 2020 issued in Application No. KR 10-2015-0015184.
Korean Second Office Action dated Jul. 27, 2021 issued in Application No. KR 10-2015-0015184.
McGinniss, Vincent D., (1978) "Light Sources," Edited by: Pappas, S. Peter, UV Curing: Science and Technology; technology marketing corporation, 642 Westover Rd., Stamford, CT, USA; pp. 96-129.
Rothschild, et al., "Liquid immersion lithography: Why, how, and when?" Journal Vacuum Science Technology, Nov./Dec. 2004, pp. 2877-2881.
Santillan et al., "In Situ analysis of negative-tone resist pattern formation using organic-solvent-based developer process," Applied Physics Express, vol. 7 (2014), pp. 016501-1-016501-4. [retrieved Sep. 20, 2017] URL: http:dx.doi.org/10.7567/APEX.7.016501.
Spitzer et al., (Mar. 1, 1986) "Conversion efficiencies from laser-produced plasmas in the extreme ultraviolet regime," J. Appl. Phys., 79(5):2251-2258.
Stowers et al.; "Directly patterned inorganic hard mask for EUV lithography"; proceedings of the SPIE 7969; Extreme Ultraviolet

(56) References Cited

OTHER PUBLICATIONS (EUV) Lithography 11, 796915-1-11 (Apr. 7, 2011), event: SPI E Advanced Lithography, 2011, San Jose California.
Stulen, et al., "Extreme Ultraviolet Lithography" IEEE Journal of Quantum Electronics, vol. 35, No. 5, May 1999, pp. 694-699.
Taiwanese First Office Action dated Aug. 10, 2020 issued in Application No. TW 105137362.
Taiwanese First Office Action dated May 31, 2018 issued in Application No. TW 104103153.
Taiwanese Second Office Action dated Nov. 18, 2020 issued in Application No. TW 105137362.
TW First Office Action dated Oct. 6, 2021, in application No. TW20180116415 with English translation.
U.S. Final Office Action, dated Feb. 5, 2019 issued in U.S. Appl. No. 15/495,701.
U.S. Final Office Action, dated May 11, 2017, issued in U.S. Appl. No. 14/610,038.
U.S. Final Office Action, dated Sep. 10, 2018, issued in U.S. Appl. No. 15/691,659.
U.S. Notice of Allowance, dated Apr. 25, 2018 issued in U.S. Appl. No. 14/948,109.
U.S. Notice of Allowance, dated Aug. 22, 2017, issued in U.S. Appl. No. 14/610,038.
U.S. Notice of Allowance, dated Jul. 28, 2020, issued in U.S. Appl. No. 16/206,959.
U.S. Notice of Allowance, dated Jun. 10, 2020 issued in U.S. Appl. No. 15/979,340.
U.S. Notice of Allowance dated Sep. 15, 2021, issued in U.S. Appl. No. 16/691,508.
U.S. Notice of Allowance, dated Sep. 19, 2019, issued in U.S. Appl. No. 15/691,659.
U.S. Notice of Allowance, dated Sep. 30, 2021 issued in U.S. Appl. No. 17/008,095.
U.S. Notice of Allowance dated Sep. 9, 2021, issued in U.S. Appl. No. 16/691,508.
U.S. Office Action, dated Apr. 9, 2019, issued in U.S. Appl. No. 15/691,659.
U.S. Office Action, dated Aug. 9, 2018 issued in U.S. Appl. No. 15/495,701.
U.S. Office Action, dated Jan. 23, 2017, issued in U.S. Appl. No. 14/610,038.
U.S. Office Action, dated Mar. 18, 2021 issued in U.S. Appl. No. 17/008,095.
U.S. Office Action, dated Mar. 5, 2020, issued in U.S. Appl. No. 16/206,959.
U.S. Office Action dated May 14, 2021, issued in U.S. Appl. No. 16/691,508.
U.S. Office Action, dated May 21, 2018, issued in U.S. Appl. No. 15/691,659.
U.S. Office Action, dated Nov. 2, 2017, issued in U.S. Appl. No. 14/948,109.
U.S. Office Action, dated Nov. 6, 2019 issued in U.S. Appl. No. 15/979,340.
U.S. Appl. No. 17/593,371, inventors Zhou et al., filed Sep. 16, 2021.
U.S. Appl. No. 17/645,939, filed Dec. 23, 2021.
U.S. Supplemental Notice of Allowability dated Jan. 26, 2022, in U.S. Appl. No. 17/008,095.
Wang, et al., "Lithography Simulation for the Fabrication of Silicon Photonic Devices with Deep-Ultraviolet Lithography" IEEE, (2012) pp. 288-290.
Banerjee, D. et al., "Potential of Metal-Organic Frameworks for Separation of Xenon and Krypton", Accounts of Chemical Research, 2015, vol. 48, No. 2, pp. 211-219.
Cardineau, B. et al., "EUV Resists Based on Tin-oxo Clusters", Advances in Patterning Materials and Processes XXXI, Proceedings Of Spie, Apr. 4, 2014, vol. 9051, pp. 335-346.
CN Office Action dated Dec. 13, 2023 in CN Application No. 201810783756.6 with English translation.
CN Office Action dated Jun. 1, 2023, in application No. CN201810783756 with English translation.
CN Office Action dated Jun. 8, 2022 in Application No. CN202180002531.2 With English Translation.
CN Office Action dated Mar. 31, 2023, in Application No. CN201880046648.9 with English translation.
CN Office Action dated Nov. 16, 2022, in Application No. CN202180002531.2 with English translation.
CN Office Action dated Nov. 18, 2022, in Application No. CN201810783756.6 with English translation.
Dahuang, D., et al., Functional Thin Films and Their Deposition Preparation Techniques, Metallurgy Industrial Press, Jan. 31, 2013, pp. 450-454. [with English Translation].
Danilo D.E., et al., "Metal Containing Resist Readiness for HVM EUV Lithography", Journal of Photopolymer Science and Technology, 2016, vol. 29(3), pp. 501-507.
European Search Report dated Feb. 15, 2022, in Application No. EP21741104.
European Office Action dated Feb. 25, 2022 in Application No. 21741104.
Extended European Search Report dated Dec. 23, 2021, in Application No. EP19800353.5.
Gross, R.A. et al., "Biodegradable Polymers for the Environment", Science, Aug. 2, 2002, vol. 297, No. 5582, pp. 803-807.
Hamley, I.W., "Nanostructure fabrication using block copolymers", Nanotechnology. Sep. 2003. 17;14(10):R39-R54.
Harrisson, S. et al., "RAFT Polymerization of Vinyl Esters: Synthesis and Applications", Polymers, 2014, vol. 6, No. 5, pp. 1437-1488.
Hench, L.L. and West, J.K., "The sol-gel process," Chemical reviews, Jan. 1, 1990; 90(1) pp. 33-72.
International Preliminary Report on Patentability dated Oct. 13, 2022, in PCT Application No. PCT/US2021/023493.
International Preliminary Report on Patentability dated Oct. 13, 2022, in PCT Application No. PCT/US2021/025111.
International Search Report and Written Opinion dated Aug. 4, 2021, in PCT Application No. PCT/US2021/023493.
International Search Report and Written Opinion dated Jul. 20, 2021, in PCT Application No. PCT/US2021/025111.
International Search Report and Written Opinion dated Mar. 4, 2022, in Application No. PCT/US2021/058647.
International Search Report and Written Opinion dated Nov. 11, 2022 in PCT Application No. PCT/US2022/037733.
International Search Report and Written Opinion dated Oct. 8, 2020 in Application No. WO2020US38968.
International Preliminary Report on Patentability dated Jul. 1, 2021 issued in Application No. PCT/US2019/067540.
International Preliminary Report on Patentability dated May 27, 2021 issued in Application No. PCT/US2019/060742.
International Search Report and Written Opinion dated May 17, 2021 issued in Application No. PCT/US2021/015656.
International Preliminary Report on Patentability dated Apr. 14, 2022 issued in Application No. PCT/US2020/053856.
International Preliminary Report on Patentability dated Aug. 18, 2022 in PCT Application No. PCT/US2021/015656.
International Preliminary Report on Patentability dated Jan. 27, 2021 in Application PCT/US2020/054730.
International Preliminary Report on Patentability dated Jan. 5, 2023 in PCT Application No. PCT/US2021/034019.
International Preliminary Report on Patentability dated Jan. 5, 2023 in PCT Application No. PCT/US2021/037924.
International Preliminary Report on Patentability dated Jan. 19, 2023 in PCT Application No. PCT/US2021/040381.
International Preliminary Report on Patentability dated Jan. 26, 2023 in PCT Application No. PCT/US2021/042103.
International Preliminary Report on Patentability dated Jan. 26, 2023 in PCT Application No. PCT/US2021/042104.
International Preliminary Report on Patentability dated Jan. 26, 2023 in PCT Application No. PCT/US2021/042106.
International Preliminary Report on Patentability dated Jan. 26, 2023 in PCT Application No. PCT/US2021/042107.
International Preliminary Report on Patentability dated Jan. 26, 2023 in PCT Application No. PCT/US2021/042108.

(56) References Cited

OTHER PUBLICATIONS

International Preliminary Report on Patentability dated Jan. 6, 2022 in PCT Application No. PCT/US2020/038968.
International Preliminary Report on Patentability dated Jan. 6, 2022 in PCT Application No. PCT/US2020/039615.
International Preliminary Report on Patentability dated Jan. 6, 2022 in PCT Application No. PCT/US2020/070171.
International Preliminary Report on Patentability dated Jan. 6, 2022 in PCT Application No. PCT/US2020/070172.
International Preliminary Report on Patentability dated Jan. 6, 2022 in PCT Application No. PCT/US2020/070187.
International Preliminary Report on Patentability dated Jul. 28, 2022 in PCT Application No. PCT/US2021/012953.
International Preliminary Report on Patentability dated Sep. 9, 2022, in PCT Application No. PCT/US2021/019245.
International Search Report and Written Opinion dated May 12, 2021 issued in Application No. PCT/US2021/012953.
International Search Report and Written Opinion dated Apr. 10, 2020 issued in Application No. PCT/US2019/060742.
International Search Report and Written Opinion dated Apr. 24, 2020 issued in Application No. PCT/US2019/067540.
International Search Report and Written Opinion dated Aug. 22, 2019 issued in Application No. PCT/US2019/031618.
International Search Report and Written Opinion dated Jan. 27, 2021 issued in Application No. PCT/US2020/054730.
International Search Report and Written Opinion dated Mar. 23, 2021 issued in Application No. PCT/US2020/053856.
International Search Report and Written Opinion dated Nov. 3, 2021, in PCT Application No. PCT/US2021/042108.
International Search Report and Written Opinion dated Nov. 4, 2021 in PCT Application No. PCT/US2021/042103.
International Search Report and Written Opinion dated Nov. 4, 2021 in PCT Application No. PCT/US2021/042106.
International Search Report and Written Opinion dated Nov. 4, 2021 in PCT Application No. PCT/US2021/042107.
International Search Report and Written Opinion dated Nov. 10, 2021, in PCT Application No. PCT/US2021/042104.
International Search Report and Written Opinion dated Oct. 13, 2021, in application No. PCT/US2021/037924.
International Search Report and Written Opinion dated Oct. 16, 2020 issued in Application No. PCT/US2020/039615.
International Search Report and Written Opinion dated Oct. 16, 2020 issued in Application No. PCT/US2020/070171.
International Search Report and Written Opinion dated Oct. 16, 2020 issued in Application No. PCT/US2020/070172.
International Search Report and Written Opinion dated Oct. 16, 2020 issued in Application No. PCT/US2020/070187.
International Search Report and Written Opinion dated Oct. 28, 2021 in PCT Application No. PCT/US2021/040381.
International Search Report and Written Opinion dated Oct. 8, 2020 issued in Application No. PCT/US2020/038968.
International Search Report and Written Opinion dated Sep. 15, 2021, in PCT Application No. PCT/US2021/034019.
Joo, W. et al., "Synthesis of Unzipping Polyester and a Study of its Photochemistry", Journal of the American Chemical Society, 2019, vol. 141, No. 37, pp. 14736-14741.
JP Office Action dated Jul. 26, 2022 in Application No. JP2021102822 With English translation.
JP Office Action dated Nov. 15, 2022, in Application No. JP2021-176082 with English translation.
JP Office Action dated Jun. 14, 2022, in Application No. JP20190563508 with English translation.
JP Office Action dated Sep. 5, 2023 in Application No. JP2022-202758 with English Translation.
Klepper, K.B. et al., "Atomic Layer Deposition of Organic-inorganic Hybrid Materials Based on Saturated Linear Carboxylic Acids", Dalton Transactions, May 7, 2011, vol. 40, No. 17, pp. 4337-4748.
KR Office Action dated Feb. 8, 2022, in Application No. KR10-2021-7030794 with English Translation.
KR Office Action dated May 9, 2022, in Application No. KR1020217030794 with English translation.
KR Office Action dated May 25, 2023, in application No. KR10-2019-7037210 with English translation.
Kwon, J., et al., "Substrate Selectivity of (tBu-Allyl)Co(C0)3 during Thermal Atomic Layer Deposition of Cobalt," Chemistry of Materials, Mar. 27, 2012; 24(6): pp. 1025-1030.
Lemaire, P.C., et al., "Understanding inherent substrate selectivity during atomic layer deposition: Effect of surface preparation, hydroxyl density, and metal oxide composition on nucleation mechanisms during tungsten ALD" The Journal of chemical physics, Feb. 7, 2017, 146(5):052811.
Lu, Y., et al., "Continuous formation of supported cubic and hexagonal mesoporous films by sol-gel dip-coating" Nature, Sep. 1997, 389(6649), pp. 364-368.
Mackus, A.J., et al. "The use of atomic layer deposition in advanced nanopatterning", Nanoscale. Jul. 25, 2014; 6(19):10941-60.
Mai, L. et al., "Atomic/molecular Layer Deposition of Hybrid Inorganic-organic Thin Films from Erbium Guanidinate Precursor", Journal of Materials Science, 2017, vol. 52, No. 11, pp. 6216-6224. https://doi.org/10.1007/s10853-017-0855-6.
Meng, X., "An Overview of Molecular Layer Deposition for Organic and Organic-inorganic Hybrid Materials: Mechanisms, Growth Characteristics, and Promising Applications", Journal of Materials Chemistry A, 2017, vol. 5, pp. 18326-18378.
Molloy, K. C., "Precursors for the Formation of Tin (IV) Oxide and Related Materials", Journal of Chemical Research, 2008, vol. 2008, No. 10, pp. 549-554.
Nazarov, D.V., et al., "Atomic layer deposition of tin dioxide nanofilms: A review", Rev. Adv. Mater. Sci. Jun. 1, 2015; 40(3):262-75.
Notice of Allowance dated Dec. 9, 2021 in U.S. Appl. No. 17/310,635.
Rantala, et al., "New resist and underlayer approaches toward EUV lithography," Proc. SPIE 10809, International Conference on Extreme Ultraviolet Lithography 2018, pp. 108090X-1-108090X-8. (Oct. 11, 2018).
Shestaeva, et al., Mechanical, structural, and optical properties of PEALD metallic oxides for optical applications, Applied Optics, vol. 56, No. 4, Feb. 1, 2017). (Year: 2017).
Sundberg, P. et al., "Organic and Inorganic-organic Thin Film Structures by Molecular Layer Deposition: A Review", Beilstein Journal of Nanotechnology, 2014, vol. 5, pp. 1104-1136.
TW Office Action dated Jan. 9, 2023 In Application No. TW20190116155 with English translation.
TW Office Action dated Sep. 5, 2022, in Application No. TW110101388 with English translation.
TW Office Action dated Sep. 8, 2022 in Application No. TW111123386 with English translation.
TW Office Action dated Apr. 29, 2022 in Application No. TW110118172 with English translation.
TW Office Action dated Aug. 9, 2023, in application No. TW109114280 with English Translation.
TW Office Action dated Jan. 13, 2023, in Application No. TW110124741 with English translation.
TW Office Action dated Jan. 19, 2023 in Application No. TW110141961 with English translation.
TW Office Action dated Jul. 10, 2023 in Application No. TW109108753 with English Translation.
TW Office Action dated Mar. 7, 2022, in Application No. TW110101388 with English translation.
U.S. Final Office Action dated May 12, 2023 in U.S. Appl. No. 17/455,185.
U.S. Final Office Action dated Nov. 9, 2023 in U.S. Appl. No. 17/455,185.
U.S. Non-Final office Action dated Feb. 7, 2023 in U.S. Appl. No. 17/455,185.
U.S. Non-Final Office Action dated Nov. 24, 2023 in U.S. Appl. No. 17/593,371.
U.S. Non-Final Office Action dated Oct. 20, 2023, in U.S. Appl. No. 18/297,989.
U.S. Non-Final Office Action dated Oct. 20, 2023, in U.S. Appl. No. 18/298,003.

(56) References Cited

OTHER PUBLICATIONS

U.S. Notice of Allowance dated Feb. 22, 2022 in U.S. Appl. No. 17/310,635.
U.S. Appl. No. 17/905,754, inventors Kanakasabapathy et al., filed Sep. 6, 2022.
U.S. Appl. No. 18/005,571 inventors Hansen et al., filed Jan. 13, 2023.
U.S. Appl. No. 18/005,594, inventors Hansen et al., filed Jan. 13, 2023.
U.S. Appl. No. 18/298,003, inventors Marks et al., filed Apr. 10, 2023.
U.S. Restriction Requirement dated Nov. 14, 2022 in U.S. Appl. No. 17/455,185.
U.S. Restriction requirement dated Aug. 4, 2023, in U.S. Appl. No. 18/297,989.
U.S Restriction requirement dated Aug. 18, 2023 in U.S. Appl. No. 18/298,003.
Xu, et al., "Underlayer designs to enhance the performance of EUV resists," Proceedings of SPIE, vol. 7273, 2009, pp. 727311-1-727311-11.
Yoon, K. et al., "Fabrication of a New Type of Organic-inorganic Hybrid Superlattice Films Combined With Titanium Oxide and Polydiacetylene", Nanoscale Research Letters, Jan. 5, 2012, vol. 7, No. 71, 6 pages.
Zhou, H. et al., "Molecular Layer Deposition of Functional Thin Films for Advanced Lithographic Patterning", ACS Applied Materials & Interfaces, 2011, vol. 3, No. 2, pp. 505-511.

\* cited by examiner

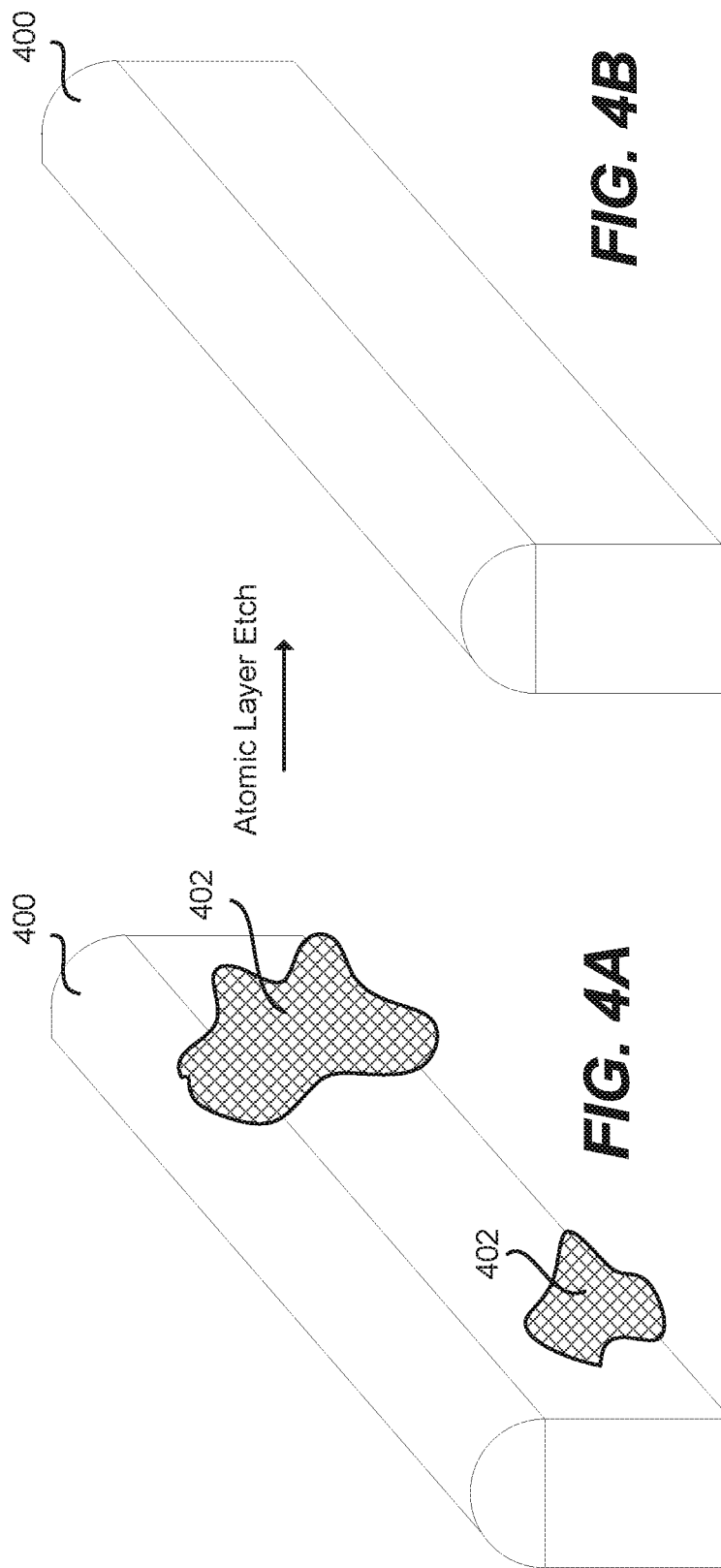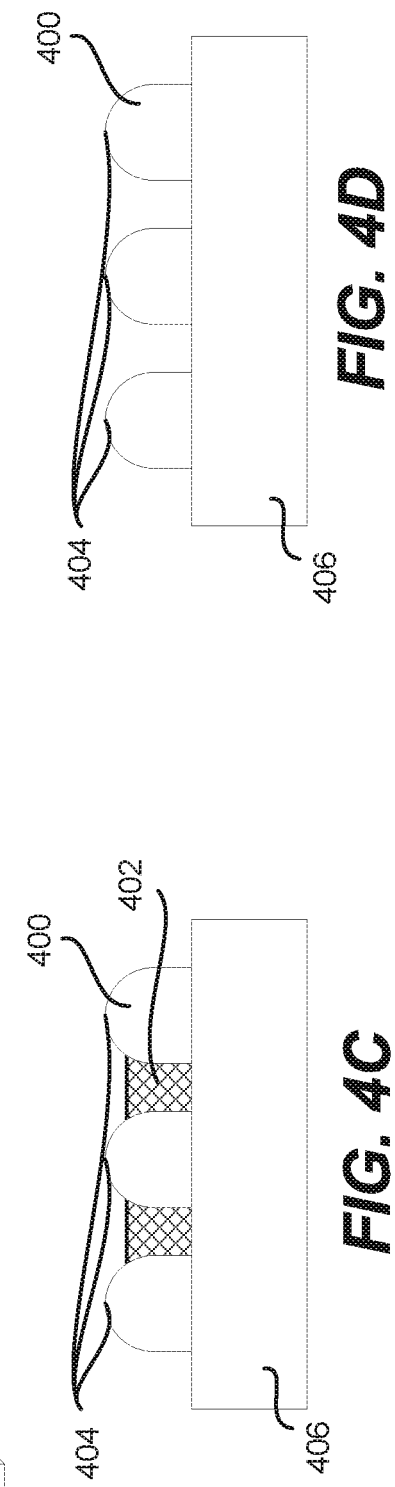

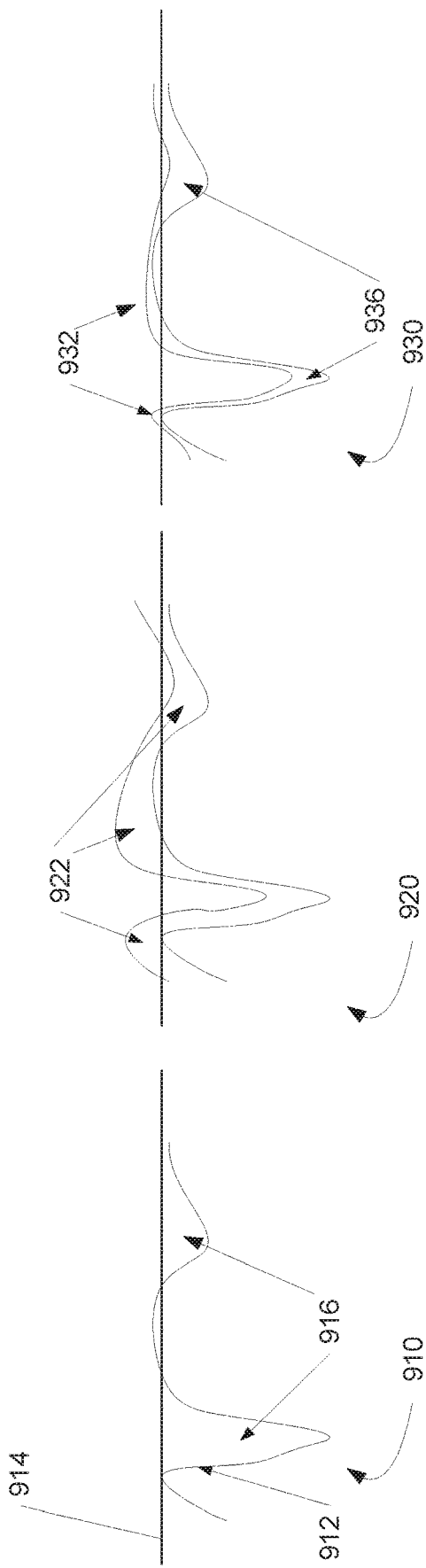
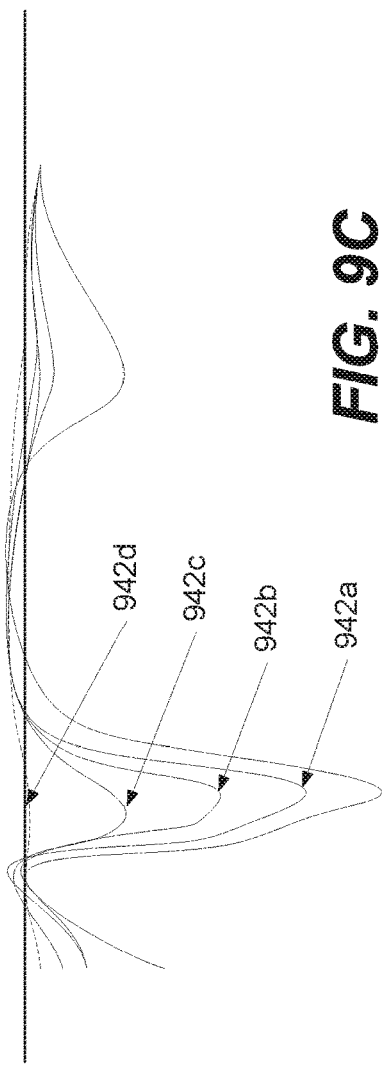
FIG. 9B
FIG. 9C

ATOMIC LAYER ETCH AND SELECTIVE DEPOSITION PROCESS FOR EXTREME ULTRAVIOLET LITHOGRAPHY RESIST IMPROVEMENT

INCORPORATION BY REFERENCE

A PCT Request Form is filed concurrently with this specification as part of the present application. Each application that the present application claims benefit of or priority to as identified in the concurrently filed PCT Request Form is incorporated by reference herein in its entirety and for all purposes

BACKGROUND

Patterning of thin films is often a critical step in the fabrication of micro- and nanoscale devices, such as in semiconductor processing for the fabrication of semiconductor devices. Patterning involves lithography. In conventional photolithography, such as 193 nm photolithography, patterns are printed by emitting photons from a photon source onto a mask and printing the pattern onto a photosensitive photoresist, thereby causing a chemical reaction in the photoresist that, after development, removes certain portions of the photoresist to form the pattern.

Advanced technology nodes (as defined by the International Technology Roadmap for Semiconductors) include nodes 22 nm, 16 nm, and beyond. In the 16 nm node, for example, the width of a typical via or line in a Damascene structure is typically no greater than about 30 nm. Scaling of features on advanced semiconductor integrated circuits (ICs) and other devices is driving lithography to improve resolution.

Extreme Ultraviolet (EUV) lithography operates on a 30 nm scale with a different light source and photoresist materials. EUV lithography can cause roughness in the photoresist due to stochastic effects. EUV lithography may also use photoresist materials that have insufficient etch selectivity to an underlying layer being etched. Both properties are undesirable.

SUMMARY

Disclosed herein are methods and systems for reducing roughness of an EUV resist and improving etched features. This may be done by descumming, divot filling, and protecting EUV resists. The resulting EUV resist has smoother features and increased selectivity to an underlying layer, which improves the quality of etched features.

In one aspect of the embodiments presented herein, a method includes: providing to a processing chamber a semiconductor substrate including a patterned EUV resist exposing a portion of an underlying metal oxide layer; treating the exposed portion of the metal oxide layer with a halogen-containing plasma; selectively depositing a silicon-containing precursor on carbon-containing features of the patterned EUV resist; and treating the silicon-containing precursor to convert the silicon-containing precursor to a silicon oxide cap on the carbon-containing features of the patterned EUV resist. In some embodiments, treating the exposed portion of the metal oxide layer with a halogen-containing plasma is performed with a voltage bias between 0V and 100V, inclusive. In various embodiments, the halogen-containing plasma comprises a hydrogen halide. In some implementations, the halogen-containing plasma comprises HBr. In various embodiments, the silicon-containing precursor is selective to the carbon containing features compared to the metal oxide layer treated with the halogen-containing plasma at a ratio greater than about 10:1.

In some embodiments, the method further includes etching the underlying metal oxide layer using the silicon oxide cap and patterned EUV resist as a mask. In some embodiments, the silicon-containing precursor comprises one or more of $SiH_4$, $Si_2H_2$, or $SiCl_4$. In various embodiments, treating the silicon-containing precursor uses an oxygen-containing reactant. In some implementations, the oxygen-containing reactant is chosen from the group of $H_2O$, NO, $N_2O$, $CO_2$, $O_2$, or $O_3$.

In various embodiments, the method further includes, prior to treating the metal oxide layer with a halogen-containing plasma, removing non-desirable carbon material (scum) from carbon containing features of the patterned EUV resist using an atomic layer etch (ALE) process including: exposing the patterned EUV resist to a halogen-containing gas to modify the scum on a surface of the carbon-containing features; and exposing the modified scum on the surface of the patterned EUV resist to a plasma of an inert gas to remove the modified scum. In some embodiments, the halogen-containing gas comprises one or more of a halogen gas and a halide gas. In some embodiments, the halogen gas is $Cl_2$ or $Br_2$. In various embodiments, the halide gas is $CF_4$ or HBr. In some embodiments, the inert gas comprises helium, neon, argon, or xenon. In some embodiments, exposing the modified scum on the surface of the patterned EUV resist to a plasma is performed at a voltage bias between 0V and 100 V, inclusive.

In various embodiments, the method further includes, after selectively depositing a silicon-containing precursor, modifying a surface layer of the precursor, and exposing the semiconductor substrate to a plasma of an inert gas to remove the modified layer of the precursor by atomic layer etch (ALE). In some implementations, the method further includes repeating the selective deposition and ALE operations to fill divots on carbon-containing features of the patterned EUV resist. In various embodiments, the method further includes etching the metal oxide layer using the silicon oxide cap and patterned EUV resist as a mask.

In another aspect of the embodiments disclosed herein, a method is provided that includes: providing to a processing chamber a semiconductor substrate including a patterned EUV resist exposing a portion of an underlying metal oxide layer; selectively depositing an amorphous carbon cap on carbon-containing features of the patterned EUV resist by exposing the semiconductor substrate to a gas mixture including hydrocarbon, hydrogen, and insert gas in the presence of a plasma. In some embodiments, the hydrocarbon is $CH_4$ or $C_2H_2$. In some implementations, the inert gas comprises helium, neon, argon, or xenon. In various embodiments, the method further includes, prior to selectively depositing an amorphous carbon cap, removing non-desirable carbon material (scum) from carbon containing features of the patterned EUV resist using an atomic layer etch (ALE) process including: exposing the patterned EUV resist to a halogen-containing gas to modify the scum on a surface of the carbon-containing features; and exposing the modified scum on the surface of the patterned EUV resist to a plasma of an inert gas. In some implementations, the halogen-containing gas comprises one or more of a halogen gas and a halide gas. In some embodiments, the halogen gas is $Cl_2$, or $Br_2$. In some embodiments, the halide gas is $CF_4$ or HBr. In some embodiments, the inert gas comprises helium, neon, argon, or xenon. In various embodiments, exposing the modified scum on the surface of the patterned EUV resist to a plasma is performed at a voltage bias between 0V and 100V, inclusive. In some embodiments, the method further includes etching the deposited amorphous carbon cap on the carbon-containing features of the patterned EUV resist. In some implementations, etching the deposited amorphous carbon cap comprises: exposing the amorphous carbon cap to an oxygen-containing reactant to modify the amorphous carbon; and exposing the modified amorphous carbon to a plasma of an inert gas. In various embodiments, the oxygen-containing reactant is $O_2$, $O_3$, $H_2O$, $N_2O$, NO, or $CO_2$. In some embodiments, the method further includes repeating the selective deposition and etching the deposited amorphous carbon cap to fill divots on carbon-containing features of the patterned EUV resist. In various implementations, the method further includes etching the underlying metal oxide layer using the amorphous carbon cap and patterned EUV resist as a mask.

In another aspect of the embodiments disclosed herein, a method if provided, including: providing to a chamber a semiconductor substrate including a patterned EUV resist exposing a portion of an underlying layer; and removing non-desirable carbon material (scum) from carbon-containing features of the patterned EUV resist using an atomic layer etch (ALE) process including: exposing the patterned EUV resist to a halogen-containing gas to modify scum on a surface of the patterned EUV resist; and exposing the modified scum on the surface of the patterned EUV resist to a plasma of an inert gas. In some implementations, the underlying layer is a spin-on glass (SOG) layer or metal containing oxide. In some embodiments, the method further includes repeating in cycles: exposing the patterned EUV resist to a halogen-containing gas to modify scum on a surface of the patterned EUV resist; and exposing the modified scum on the surface of the patterned EUV resist to a plasma of an inert gas. In various embodiments, the halogen-containing gas comprises one or more of a halogen gas or a halide gas. In some embodiments, the halogen gas is $Cl_2$ or $Br_2$. In some implementations, the halide gas is $CF_4$ or HBr. In some embodiments, the inert gas comprises helium, neon, argon, neon, or xenon. In some embodiments, exposing the modified scum on the surface of the patterned EUV resist is performed with a voltage bias between 0V and 100V, inclusive. In various embodiments, the method further includes: selectively depositing a silicon-containing oxide precursor on the patterned EUV resist; repeating the (ALE) process including: exposing the patterned EUV resist to a halogen-containing gas to modify scum on a surface of the patterned EUV resist; and exposing the modified scum on the surface of the patterned EUV resist to a plasma of an inert gas; and treating the silicon-containing precursor to develop a silicon oxide cap on the carbon containing features of the patterned EUV resist.

In some implementations, the method further includes repeating for one or more cycles, before treating the silicon-containing oxide precursor to develop a silicon oxide cap on the carbon-containing features of the patterned EUV resist: selectively depositing a silicon-containing precursor on the patterned EUV resist; and repeating the (ALE) process including: exposing the patterned EUV resist to a halogen-containing gas to modify scum on a surface of the patterned EUV resist; and exposing the modified scum on the surface of the patterned EUV resist to a plasma of an inert gas. In various implementations, the aspect ratio between the patterned EUV resist and the exposed portions of the underlying layer is no more than 5:1. In various embodiments, the method further includes etching the underlying layer using the silicon oxide cap and patterned EUV resist as a mask.

In various embodiments, the method further includes: selectively depositing a carbon-containing material on the patterned EUV resist by exposing the semiconductor substrate to a gas mixture including hydrocarbon, hydrogen, and an insert gas in the presence of a plasma; modifying a surface layer of the selectively deposited carbon-containing material; and exposing the semiconductor substrate to a plasma of an inert gas to remove the modified surface layer by atomic layer etch (ALE). In various embodiments, the inert gas comprises helium, neon, argon, or xenon. In some embodiments, the method further includes repeating the selective deposition and ALE operations to fill divots on carbon-containing features of the patterned EUV resist. In various implementations, the method further includes exposing a substrate including a carbon-containing material to a halogen-containing gas to modify a surface of the carbon-containing material; and exposing the modified layer to an inert gas plasma for a duration sufficient to remove the modified surface.

These and other features of the disclosed embodiments will be described in detail below with reference to the associated drawings.

BRIEF DESCRIPTION OF DRAWINGS

FIGS. 4A-D presents illustrations of scum and removing scum.

FIG. 9A-C present illustrations of divot filling according to embodiments disclosed herein.

DETAILED DESCRIPTION

Figure 1:
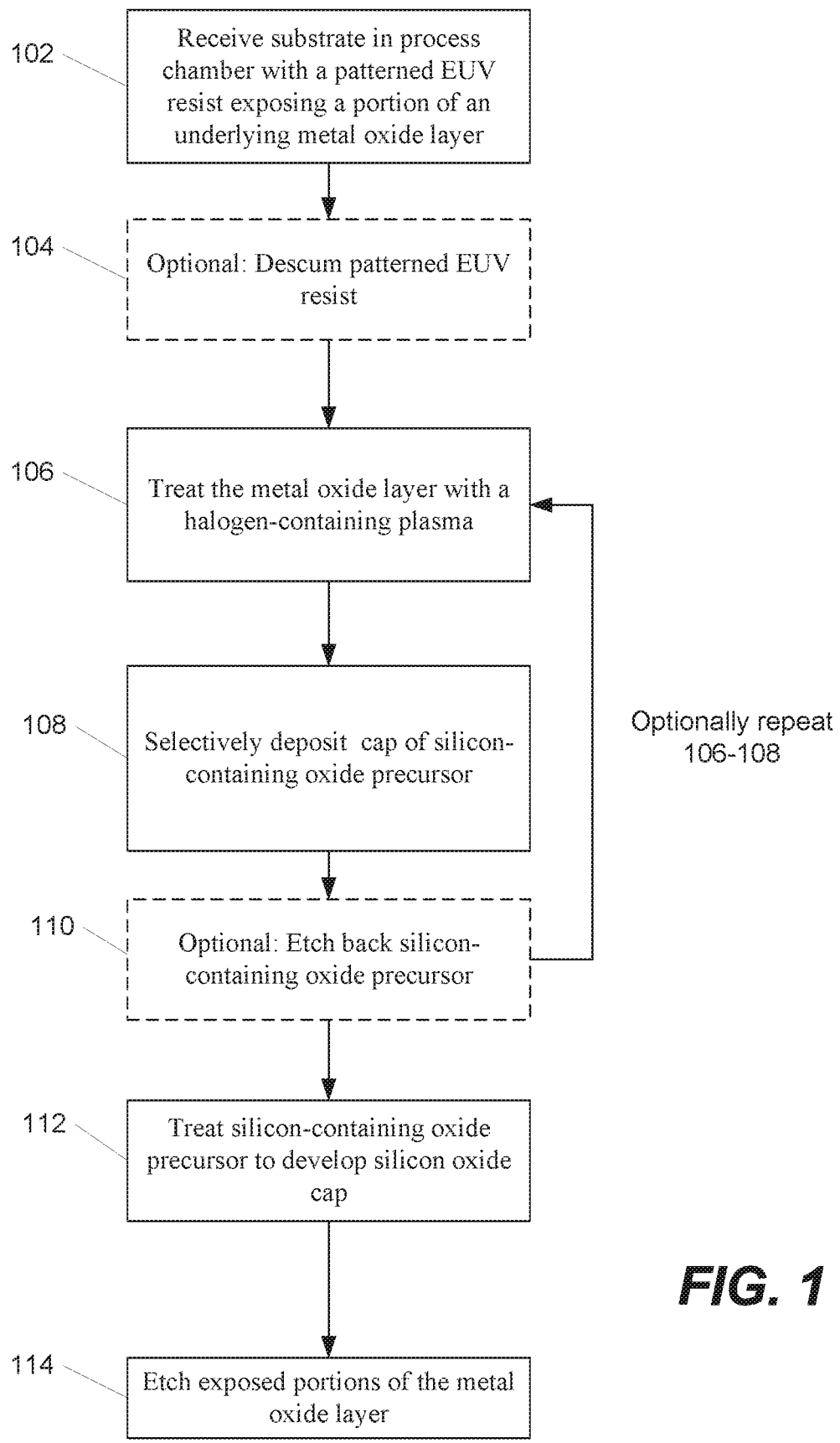
FIG. 1 presents a process flow diagram of operations for one example embodiment.

In the following description, numerous specific details are set forth to provide a thorough understanding of the presented embodiments. Embodiments disclosed herein may be practiced without some or all of these specific details. In other instances, well-known process operations have not been described in detail to not unnecessarily obscure the disclosed embodiments. Further, while the disclosed embodiments will be described in conjunction with specific embodiments, it will be understood that the specific embodiments are not intended to limit the disclosed embodiments.

Extreme Ultraviolet (EUV) lithography finds use in semiconductor fabrication at the 30 nm and below technology nodes. Patterned EUV resists may be used to etch a pattern into underlying layers, which requires enough thickness and/or etch selectivity of the patterned EUV resist to maintain the pattern while the layers are being etched. Increasing the thickness or etch selectivity of the patterned EUV resist can improve the transfer of the pattern to underlying layers following an etch process.

An approach to increase the thickness and etch selectivity of the patterned EUV resist is to deposit a sacrificial mask, or cap, on the patterned EUV resist. The cap may inhibit etching of the resist, thereby protecting it. Selective deposition of the cap may be performed to protect the top of the patterned EUV resist while permitting etching of exposed features, such as an underlying metal oxide layer.

Patterned EUV resists may also exhibit roughness, which may be measured by line edge roughness (LER) and line width roughness (LWR) of the resist and the resulting etch. Reducing (e.g., minimizing) roughness of the resist and the resulting etch can improve process yield and device performance at increasingly smaller critical dimensions. Reducing (e.g., minimizing) both LER and LWR can enhance the results of the EUV lithography etch process.

Incomplete removal of material following extreme ultraviolet lithographic processing of photoresists during patterning operations can increase roughness by leaving residues, referred to as "scum," on patterned EUV resists. Scum can impact the etch of the pattern into underlying layers, which is undesirable. Scum removal, or "descumming," without damaging other features or structures on a semiconductor substrate is desirable for patterning precision. Descumming (or "descum") refers to a process of removing non-desirable carbon material from in between carbon-containing wafer features, such as patterned EUV resists. Thus, removal of scum can improve patterning methods and reduce roughness.

Extreme ultraviolet lithographic processing of photoresists during patterning operations can also create "divots" on patterned EUV resists, which are areas that are thinner than surrounding EUV resist. Divots may cause defects in the underlying layers by failing to mask the underlying layers during an etch process, leading to undesired etching of the underlying layer. Divot filling refers to a process of adding material to reduce variation in line thickness of wafer features, such as patterned EUV resists. Divot filling without collapsing or obscuring features or structures on a semiconductor substrate is desirable for patterning precision. Thus, filling of divots can improve patterning methods and prevent bridging defects.

In some embodiments divot filling may include cycling selective deposition and selective etch to fill divots without meaningfully increasing aspect ratio or depositing material between features. Selective deposition will only deposit on the carbon-containing features of the patterned EUV resist. Selective etch will etch inside divots at a lower rate than the non-divot areas. Thus, by repeating these two operations divots will be filled while maintaining the critical dimension of the patterned EUV resist. In some embodiments divot filling occurs as part of depositing a cap.

Provided herein are methods of depositing a cap, removing scum, and filling divots to improve patterning precision within a die, a wafer, and from lot-to-lot for EUV resists. Such techniques selectively improve etch selectivity of the patterned EUV resist and reduce roughness of etched features without modifying feature critical dimensions. Disclosed embodiments may perform one, two, or all three of depositing a cap, removing scum, and filling divots.

In various embodiments disclosed herein a semiconductor substrate is provided to a process chamber. The semiconductor substrate may be a silicon or other semiconductor wafer, e.g., a 200-mm wafer, a 300-mm wafer, or a 450-mm wafer, including wafers having one or more layers of material, such as dielectric, conducting, or semi-conducting material, deposited thereon. In some embodiments, the semiconductor substrate includes a blanket layer of silicon, such as amorphous silicon, or a blanket layer of germanium. The semiconductor substrate includes a patterned EUV resist previously deposited and patterned on the semiconductor substrate.

Figure 11:
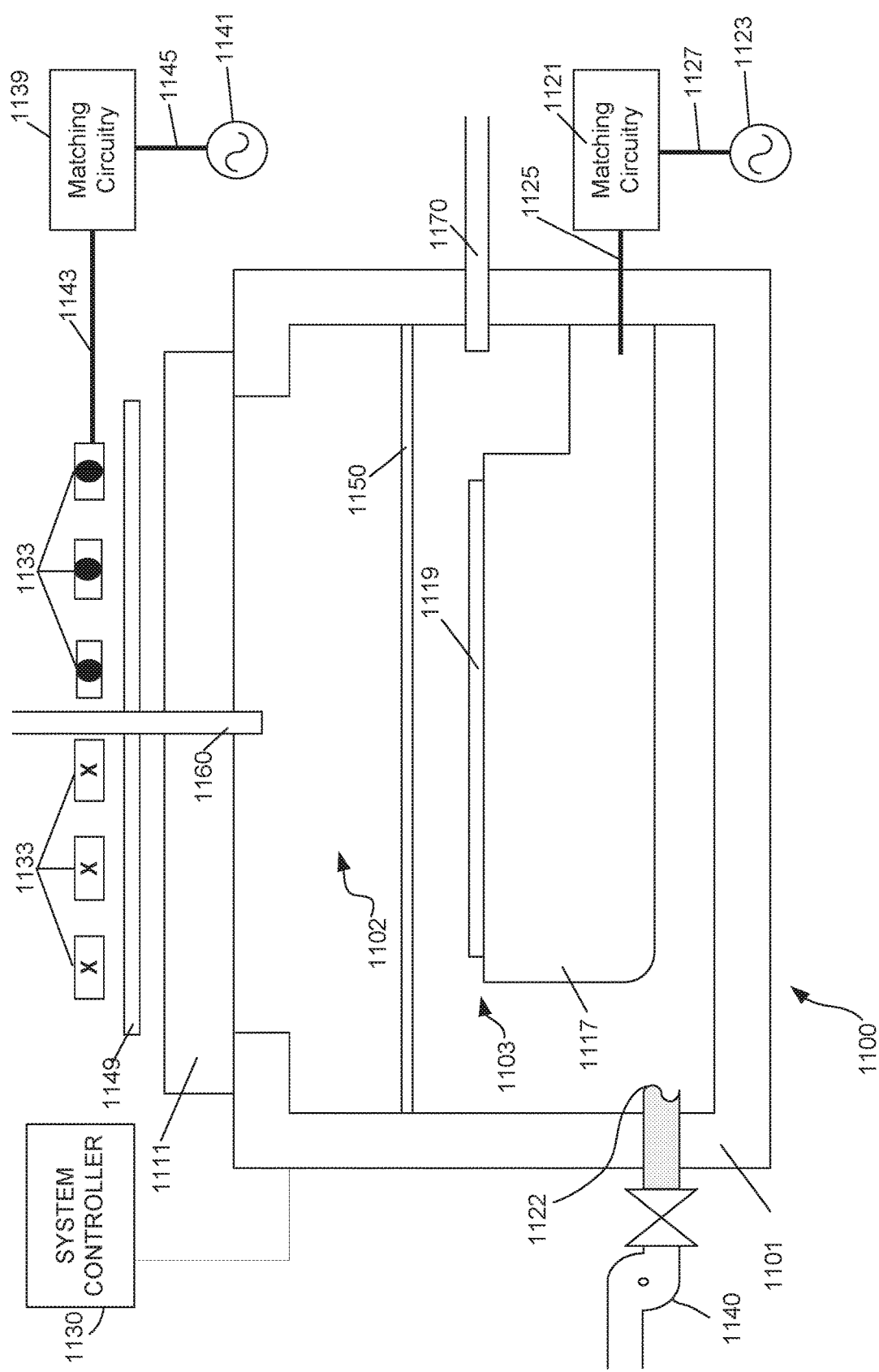
FIGS. 11 and 12 are schematic diagrams of examples of process chambers for performing methods in accordance with disclosed embodiments.
Figure 12:
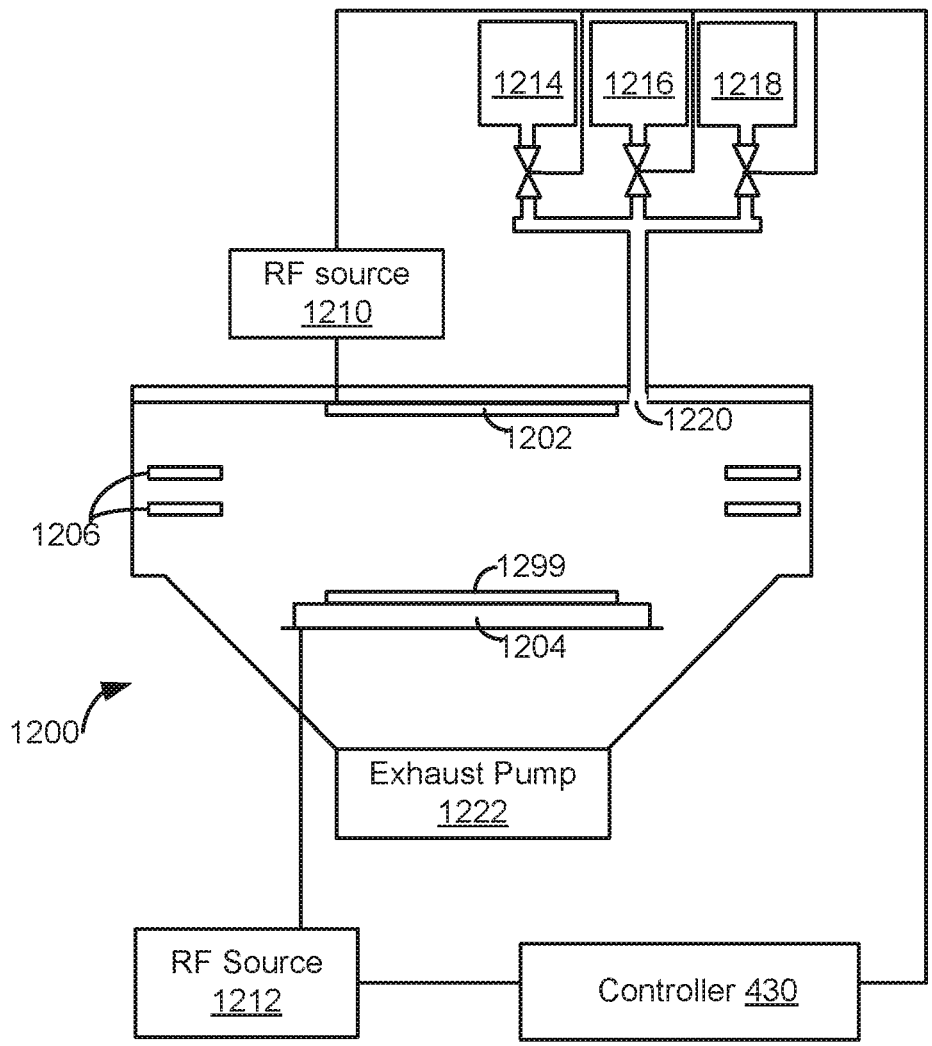

The process chamber is a semiconductor processing chamber and may be a process chamber in a multi-chamber apparatus or a single chamber apparatus, e.g. such as that shown by FIGS. 11 and 12. The semiconductor substrate may reside on a pedestal for holding the substrate.

The patterned EUV resist layer may be made of a variety of materials. In some embodiments the patterned EUV resist layer may be made of organic metal oxide-containing films, such as organotin oxides, such as are available from Inpria Corp., or traditional chemically amplified resists from Dow/Rohm, Fujifilm, JSR, TOK, and Shin-Etsu Polymer. The patterned EUV resists may also comprise chemically amplified resists. The patterned EUV resist layer may be 10-40 nm thick, for example.

FIG. 1 provides a process flow diagram for performing operations of a method in accordance with disclosed embodiments. The method depicted in FIG. 1 may be performed as part of a process to etch a metal oxide layer. In operation 102 a semiconductor substrate (or substrate) with a patterned EUV resist exposing a portion of an underlying metal oxide layer is received in a process chamber. The semiconductor substrate may be in the process chamber from a previous operation or may be introduced to the process chamber.

Operation 104 is an optional operation to descum the patterned EUV resist. In some embodiments Operation 104 is performed to descum the patterned EUV resist, while in other embodiments operation 104 may not be performed. Whether operation 104 is performed may depend on whether any scum on the substrate impacts the critical dimension of the patterned EUV resist.

Figure 3:
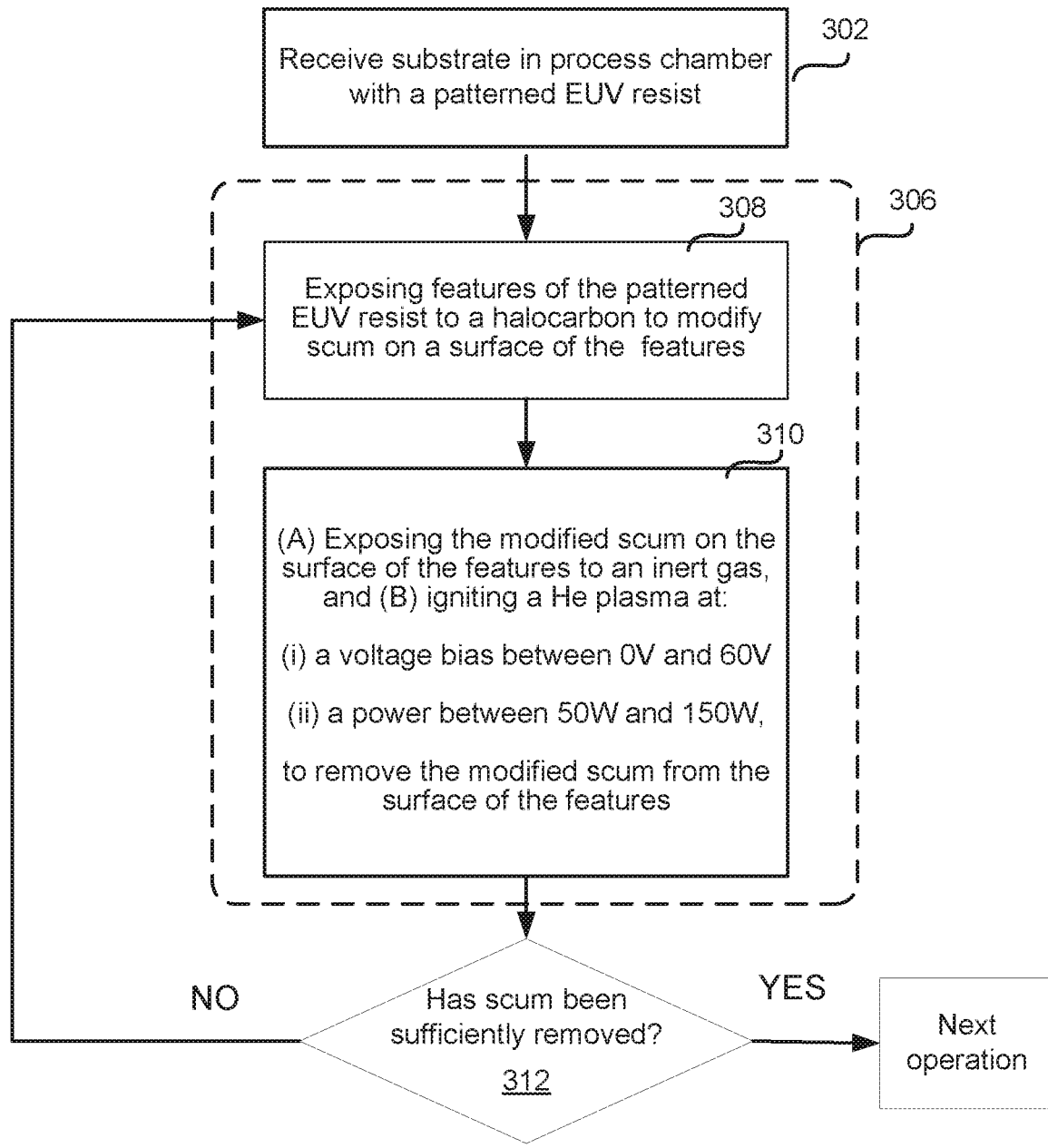
FIG. 3 presents a process flow diagram of operations for descumming.

FIG. 3 provides a process flow diagram for descumming a patterned EUV resist, such as would be performed in operation 104. In operation 302 a substrate with a patterned EUV resist is received in a process chamber. The semiconductor substrate may be in the process chamber from a previous operation or may be introduced to the process chamber. The patterned EUV resist exposes portions of an underlying layer. In the context of FIG. 1, the underlying layer is a metal oxide layer. However, the method of FIG. 3 may be used with a variety of layers, including dielectric layers and conducting layers, e.g., silicon oxides, silicon nitrides, silicon carbides, metal oxides, metal nitrides, metal carbides, and metal layers.

Operation 306, which includes both operations 308 and 310, removes scum by an atomic layer etch (ALE) process. A background knowledge of ALE is helpful to explain operation 306. Generally, ALE may be performed using any suitable technique. Examples of atomic layer etch techniques are described in U.S. Pat. No. 8,883,028, issued on Nov. 11, 2014; and U.S. Pat. No. 8,808,561, issued on Aug. 19, 2014, which are herein incorporated by reference for purposes of describing example ALE and etching techniques. Examples of ALE techniques integrated with atomic layer deposition (ALD) techniques are described in U.S. Pat. No. 9,576,811, issued on Feb. 21, 2017 which is incorporated by reference herein. In various embodiments, ALE may be performed with plasma, or may be performed thermally.

ALE is performed in cycles. The concept of an "ALE cycle" is relevant to the discussion of various embodiments herein. Generally, an ALE cycle is the minimum set of operations used to perform an etch process one time, such as etching a monolayer. The result of one cycle is that at least some of a film layer on a substrate surface is etched. Typically, an ALE cycle includes a modification operation to form a reactive layer, followed by a removal operation to remove or etch only this modified layer. The cycle may include certain ancillary operations such as purging one of the reactants or byproducts.

Figure 2:
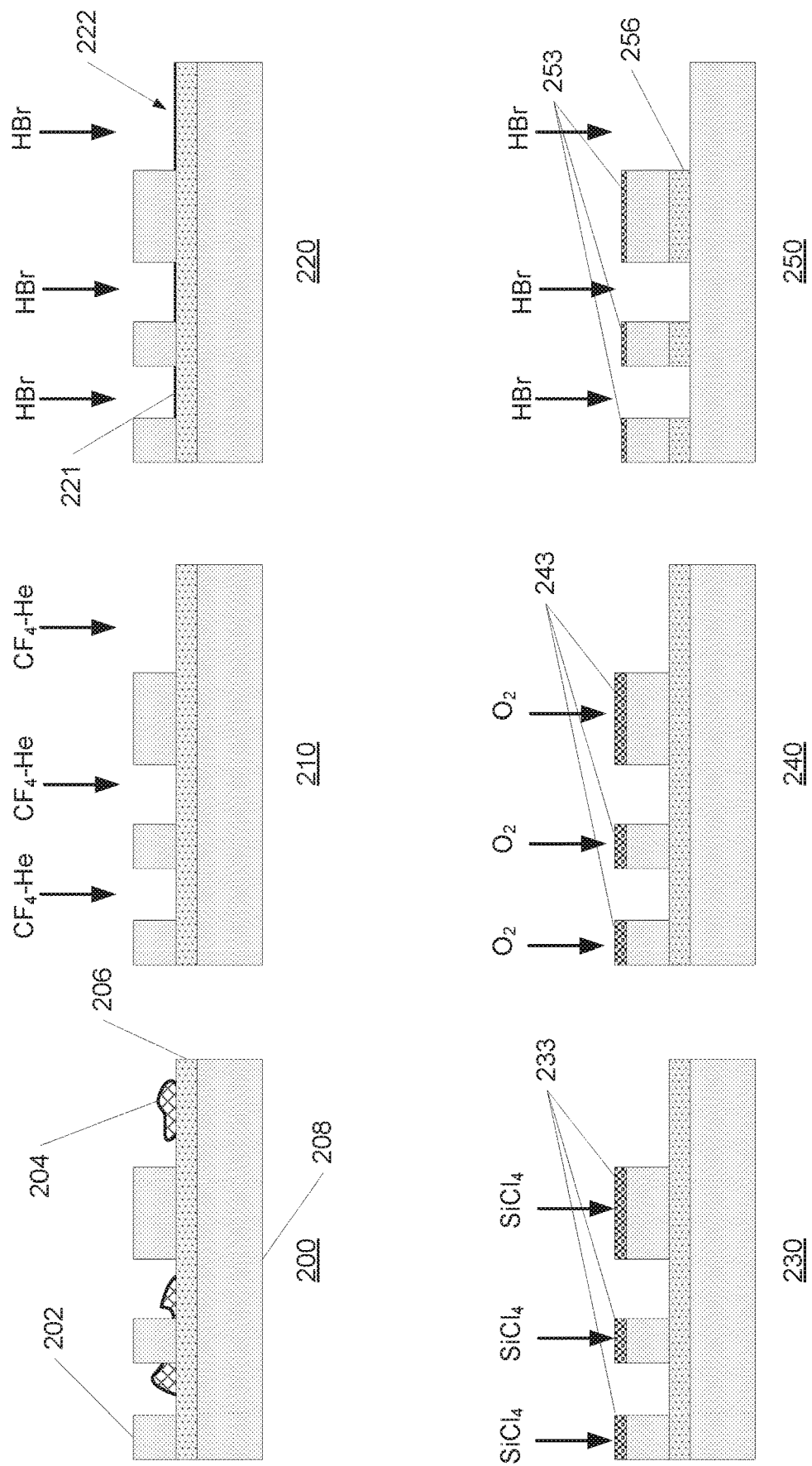
FIG. 2 presents an illustration of one example embodiment.
Figure 10:
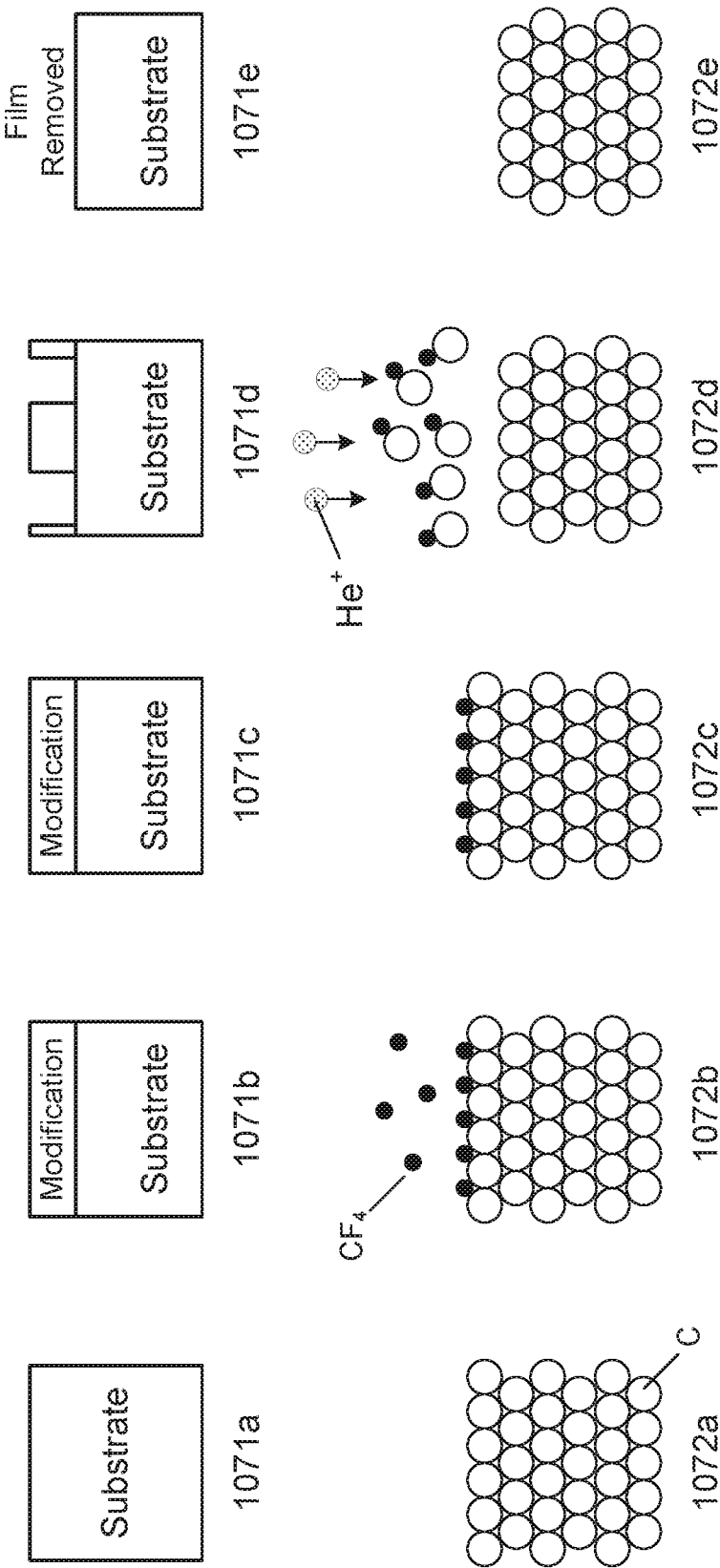
FIG. 10 is a schematic illustration of an atomic layer etch (ALE) process.

Generally, an ALE cycle contains one instance of a unique sequence of operations. As an example, an ALE cycle may include the following operations: (i) delivery of a reactant gas, (ii) purging of the reactant gas from the chamber, (iii) delivery of a removal gas and an optional plasma, and (iv) purging of the chamber. In some embodiments, etching may be performed non-conformally. FIG. 10 shows two example schematic illustrations of an ALE cycle. Diagrams 1071a-1071e show a generic ALE cycle. In 1071a, the substrate is provided. In 1071b, the surface of the substrate is modified. In 1071c, the next operation is prepared. In 1071d, the modified layer is being etched. In 1071e, the modified layer is removed. Similarly, diagrams 1072a-1072e show an example of an ALE cycle for etching a carbon containing film. In 1072a, a carbon containing substrate is provided, which includes many carbon atoms. In 1072b, reactant gas tetrafluoromethane ($CF_4$) is introduced to the substrate which modifies the surface of the substrate. The schematic in 1072b shows that some $CF_4$ is adsorbed onto the surface of the substrate as an example. Although $CF_4$ is depicted in FIG. 2, any halogen-containing species or suitable reactant may be used. In 1072c, the reactant gas $CF_4$ is purged from the chamber.

In 1072d, a removal gas helium is introduced with a directional plasma as indicated by the He+ plasma species and arrows, and ion bombardment is performed to remove the modified surface of the substrate. Although He is depicted in FIG. 2, it will be understood that other removal gases may be used, such as helium, nitrogen, argon, and combinations thereof. During removal, a bias may be applied to the substrate to attract ions toward it. For ALE, bias is often applied to the substrate to attain a desired degree of ion directionality toward the substrate. Thus, ions may be targeted to effectively remove scum from the substrate. In some embodiments, however, a bias is not used in order to reduce sputtering of the substrate and remove less material. In 1072e, the chamber is purged and the byproducts are removed.

A complete ALE cycle may only partially etch about 0.1 nm to about 50 nm of material, or between about 0.1 nm and about 5 nm of material, or between about 0.2 nm and about 50 nm of material, or between about 0.2 nm and about 5 nm of material. The amount of material etched in a cycle may depend on the purpose of the etching; for example, the amount of material etched depends on the desired critical dimension of the layer, e.g. less than 3 Å, or within a range of 2 Å to 20 Å, to be etched using patterned carbon-containing material after etching the carbon-containing material to form the pattern.

Returning to FIG. 3, in operation 308 the substrate is exposed to a halogen-containing gas, e.g., carbon tetrafluoride ($CF_4$), with or without igniting a plasma, to modify a surface of the carbon-containing material, e.g., on mandrels 100, on the substrate. The modification operation 308 forms a thin, reactive surface layer with a thickness, e.g., such as less than 3 Å, that is more easily removed than the unmodified material in a subsequent removal operation. Suitable halogen-containing gases include, but are not limited to: halocarbons, including fluorocarbons ($C_xF_y$), including $CF_4$, hydrofluorocarbons $C_xH_yF_z$), organochlorides, organobromides ($C_xBr_y$), and organoiodides ($C_xI_y$), halides, including HBr, HCl, HF, and HI, and halogen gases, including $Br_2$, $Cl_2$, $F_2$, and $I_2$. In some embodiments the halogen-containing gas is $Br_2$ or $Cl_2$. In some embodiments the halogen-containing gas is $CF_4$ or HBr. Halogen dosing of the substrate generates a saturated monolayer or sub-monolayer on the substrate. Halogens may be adsorbed onto the surface of the substrate without reacting with the carbon-containing material. Halogen-containing gases may be optionally accompanied by a carrier gas which may be any of helium, nitrogen, argon, neon, xenon, and combinations thereof. Operation 308 may be performed for a duration sufficient to obtain complete saturation of the substrate surface with the halogen-containing gas. In some embodiments, the duration may be about 0.1 second. In some embodiments, the duration may be between about 0.1 seconds and about 3 seconds, such as about 0.5 seconds, or about 1 second. For example, in some embodiments, the chamber pressure may be about 5 mTorr to 100 mTorr, chamber temperature less than 60° C., plasma power per substrate station between about 50 W and about 150 W, and voltage bias between 0V and 60V. The reactant flow may be between 100 sccm-300 sccm. All process conditions ranges are inclusive.

In operation 310, the substrate, including the saturated monolayer, is exposed to an inert gas and a plasma is ignited to remove the modified surface. The plasma applied in operation 310 may be a helium-containing, or helium-derived plasma with a frequency of 13.56 MHz or 27 MHz. Plasmas derived, or generated, from $N_2$ may also be employed. The selection of a plasma may be determined on the number of ligands, or co-ligands, associated with a plasma generated from a given gas. For instance, lower amounts of ligands, or co-ligands, tend to result in the plasma demonstrating relatively directional behavior. However, lower amounts of ligands, or co-ligands, may result in relatively energized ions, e.g. of the plasma, which thus etch more.

In some embodiments, frequencies of 400 kHz and 60 MHz may be employed to control ion energy. Also, optionally, pulsed plasma activation techniques and dual-frequency activation, e.g. tandem low and high frequency, may be employed. Plasma sources may include capacitively-coupled reactors (CCPs) or inductively coupled reactors (ICPs) as delivered from a SHD, or are thermal-based, ultraviolet-based, or photon-based.

The inert gas may be selected from a group including, but not limited to, Ar, He, $N_2$, or the substrate may be alternatively exposed to a vacuum. To remove scum modified upon exposure to a halogen-containing gas as shown in operation 308, the surface of the features and the substrate may be exposed to an energy source at operation 310. Suitable energy sources may include activating or sputtering gases or chemically reactive species that induce removal, such as helium, to etch (or descum) the substrate by directional sputtering. In some embodiments, the removal operation may be performed by ion-bombardment. In some embodiments operations 302-312 are performed with a voltage bias to modulate the directionality of etching to achieve a desired profile. In some embodiments operations 302-312 are performed without a voltage bias to isotropically remove scum from the surface of the features.

The amount of sputtering gas may be controlled to etch (or descum) only a targeted amount of material, such as less than 3 Å, or within a specified range of 2 Å to 20 Å. For example, sputtering gases such as helium or argon may be flowed to a process chamber at 100-300 sccm. Further, the etch (or descum) profile of the substrate may be controlled by modifying the ratio of helium to argon. Generally, greater helium content will etch less and reduce sputtering, while greater Argon content will etch more and increase sputtering. In some embodiments, the pressure of the chamber may vary between modification and removal operations. The pressure of the gas may depend on the size of the chamber, the flow rate of the gas, the temperature of the reactor, the type of substrate, and the size of substrate to be etched. In some embodiments, higher pressure of the gas may allow for relatively faster cycle completion times. In some embodiments the chamber pressure is between 5 mTorr and 100 mTorr.

Plasma is ignited at a plasma power selected to reduce sputtering of the material on the substrate surface while controlling the amount of material etched in each cycle. In some embodiments, the plasma power for a single substrate station may be between about 50 W and about 150 W, e.g. 100 W. Although the use of plasma may cause some sputtering in general, sputtering may be generally controlled by performing disclosed embodiments at a low plasma power and low voltage bias, or pulsing the voltage bias, to obtain fine-tuned control over the amount of material etched per cycle and to thereby pattern carbon-containing material to obtain vertical, or clean, feature sidewalls. For example, in some embodiments, the chamber pressure may be about 5 mTorr to 100 mTorr, plasma power per substrate station between about 50 W and about 150 W, and voltage bias between 0V and 100V. In some embodiments, the voltage bias may be pulsed between 0V and about 400V, or 0V and about 100V. In some embodiments, the plasma may be ignited for a duration of less than about 5 seconds, such as between about 1 second and about 5 seconds. All process conditions are inclusive.

In operation 312, it is determined whether the substrate has been sufficiently etched or cleaned. If not, operations 308-312 may be optionally repeated. Performing operation 306 may constitute one ALE cycle. In various embodiments, etching, or descumming, may be performed in cycles. The number of cycles depends on the amount of etching desired for the particular application. In various embodiments, between about 1 cycle and about 100 cycles may be used. In some embodiments, about 5 cycles to about 100 cycles may be used. In some embodiments the number of cycles may be about 1 to about 40 cycles, or about 1 to about 20 cycles, or about 30 to about 40 cycles. Any suitable number of ALE cycles may be included to etch a desired amount of film. In some embodiments, ALE is performed in cycles to etch about 1 Å to about 50 Å of the surface of the layers on the substrate. In some embodiments, cycles of ALE etch between about 2 Å and about 50 Å of the surface of the layers on the substrate. In some embodiments, the number of cycles may be selected by using optical emission spectroscopy (OES) to identify the amount of etch and set an endpoint to stop etching at the endpoint. In some embodiments, the cycle time (duration for a single cycle) may be less than 1 second. ALE, as presented and discussed in FIG. 3, may be conducted at an etch rate of 0.5 Å to 3 Å per cycle. Many ALE processes more typically remove from about 4 Å to 10 Å per cycle.

FIGS. 4A-D show a perspective and side view of a patterned EUV resist that has been descummed by the process of FIG. 3. FIG. 4A shows a perspective view of a patterned EUV resist having features, e.g., mandrel 400, with photoresist (PR) scum 402 on, or extending from, the mandrel 400. The scum 402 is removed by an atomic layer etch (ALE) process from the mandrel 400, as shown in FIG. 4B. FIGS. 4C and 4D show cross-sectional side views of an array 404 of mandrels 400 formed on a substrate 406. One of ordinary skill in the art will appreciate the substrate 406 may comprise a multi-layer stack suitable for semiconductor processing which may also include other layers, such as etch stop layers, cap layers, barrier layers, and other under-layers.

Non-desired carbon-based material, such as footings, stringers, or other forms of undesirable substrate surface roughness remaining on a substrate after lithography are collectively referred to herein as "scum," e.g., scum 402. In some embodiments, scum 402 may contain carbon at a level similar, or identical to, the mandrel 400, also referred to as a carbon-containing feature. As shown in FIG. 4C, several mandrels 400 may be oriented adjacent to one another in an array 404. Scum 402 may pose a patterning risk by remaining on substrate 406 after lithography to connect the mandrels 400, e.g. when organized, or positioned, in the array 404. Such a connection of the mandrels 400 by the scum 402 is undesirable, thus scum 402 is cleaned by an ALE process, for example as shown and described with reference to FIG. 3, leaving array 404 of mandrels 400 free from scum 402, as shown in FIG. 4D.

In some embodiments, scum 402 is a residue of the EUV resist development process that is relatively dispersed across the mandrel 400, as shown in FIG. 4A, and thus forms a thin layer on the mandrel. Such scum 402 thus has a relatively high surface area to volume ratio, and thus may be more susceptible to removal by an ALE process. Also, in some embodiments, scum 402 may be integrated with, or into, the mandrel 400, being formed of generally the same material as the scum 402. Thus, scum 402 may be thought to be an undesirable protrusion of the mandrel 400.

Returning to FIG. 1, following the optional descumming of the patterned EUV resist in operation 104, in operation 106 the substrate is exposed to a halogen-containing plasma to treat the exposed portions of the metal oxide layer. Suitable halogen-containing plasmas include hydrogen halides (HF, HCl, HBr, or HI) and diatomic halogens ($Br_2$, $Cl_2$, $F_2$, $I_2$). The halogen-containing plasma is a 'gentle' plasma, in that a sufficiently low power and low bias are used to form a halide layer on the metal oxide layer, and to not etch or nominally etch the metal oxide layer. In some embodiments a gentle plasma has a power for a single station between 10 W and 150 W, e.g. 100 W, and a voltage bias between 0V and 60V, e.g. 0V. In some embodiments the chamber pressure is between 10 mTorr and 100 mTorr, and the chamber temperature is less than 60° C., e.g. 20° C. In some embodiments the flow rate of halogen-containing gas is between 100 sccm and 300 sccm, e.g. 100 sccm. In some embodiments the exposure time, or the time that halogen-containing gas is flowing into the chamber, is between 30 s and 90 s, e.g. 60 seconds.

Halide layers can inhibit deposition on the metal oxide layer by increasing the nucleation delay for later deposition operations. When performed with a low power and bias, a halide layer will form on the exposed portions of the metal oxide layer, including open areas of the exposed portions, or areas that have a low aspect ratio to features of the patterned EUV resist, such as an aspect ratio below about 1. The halide layer inhibits the deposition of certain reactants, specifically silicon-containing precursors, by increasing the nucleation delay for such reactants.

In operation 108 a precursor layer of silicon-containing oxide precursor is deposited on the patterned EUV resist. The precursor is generally deposited "selectively" with respect with respect to the top of the features of the patterned EUV resist, such that more precursor deposits on top of the features than sidewalls or the exposed portions of the metal oxide layer. For example, in some embodiments there is no sidewall deposition of precursor. The halide layer inhibits deposition of the precursor such that the precursor does not deposit on the metal oxide layer. This inhibition, or nucleation delay time, may last for between 1 second and 6 seconds, or about 3 seconds, after which the silicon-containing precursor may also deposit on the halide layer or the exposed portions of the metal oxide layer. In some embodiments the silicon-containing precursor is $SiH_4$, $Si_2H_2$, or $SiCl_4$.

Example process conditions for depositing silicon-containing precursor are power between 100 W-500 W, e.g. 300 W, 50V-200V bias, e.g. 120V, chamber temperature below 60° C., chamber pressure between 5 mTorr and 100 mTorr, e.g. 50 mTorr, and exposure time between 1 s and 5 s. Reactant flow is between 10 sccm-50 sccm $SiCl_4$, 0 sccm-200 sccm $H_2$, and 100 sccm-300 sccm He. All process condition ranges are inclusive.

Operation 110 is an optional operation to etch back the precursor layer. In some embodiments the precursor layer is deposited for a sufficient time that it forms on the halide layer or the exposed portions of the metal oxide layer. Operation 110 may then be performed to remove such undesirable deposition, such that the net effect of operations 108 and 110 is the deposition of a precursor layer on only the patterned EUV resist, and no deposition on the halide layer or the metal oxide layer. In some embodiments operation 110 may also remove the halide layer, such that the exposed portions of the metal oxide layer no longer exhibit a nucleation delay time for deposition of silicon-containing precursors. In some embodiments, the deposition time of the precursor layer is insufficient to overcome the nucleation delay caused by the halide layer, and the precursor layer does not form on the halide layer or metal oxide layer. In such embodiments operation 110 may not be performed as the precursor layer has not deposited on the halide layer or metal oxide layer. Operation 110 may be performed according to the process flow diagram of FIG. 3 as described above.

Figure 9A:
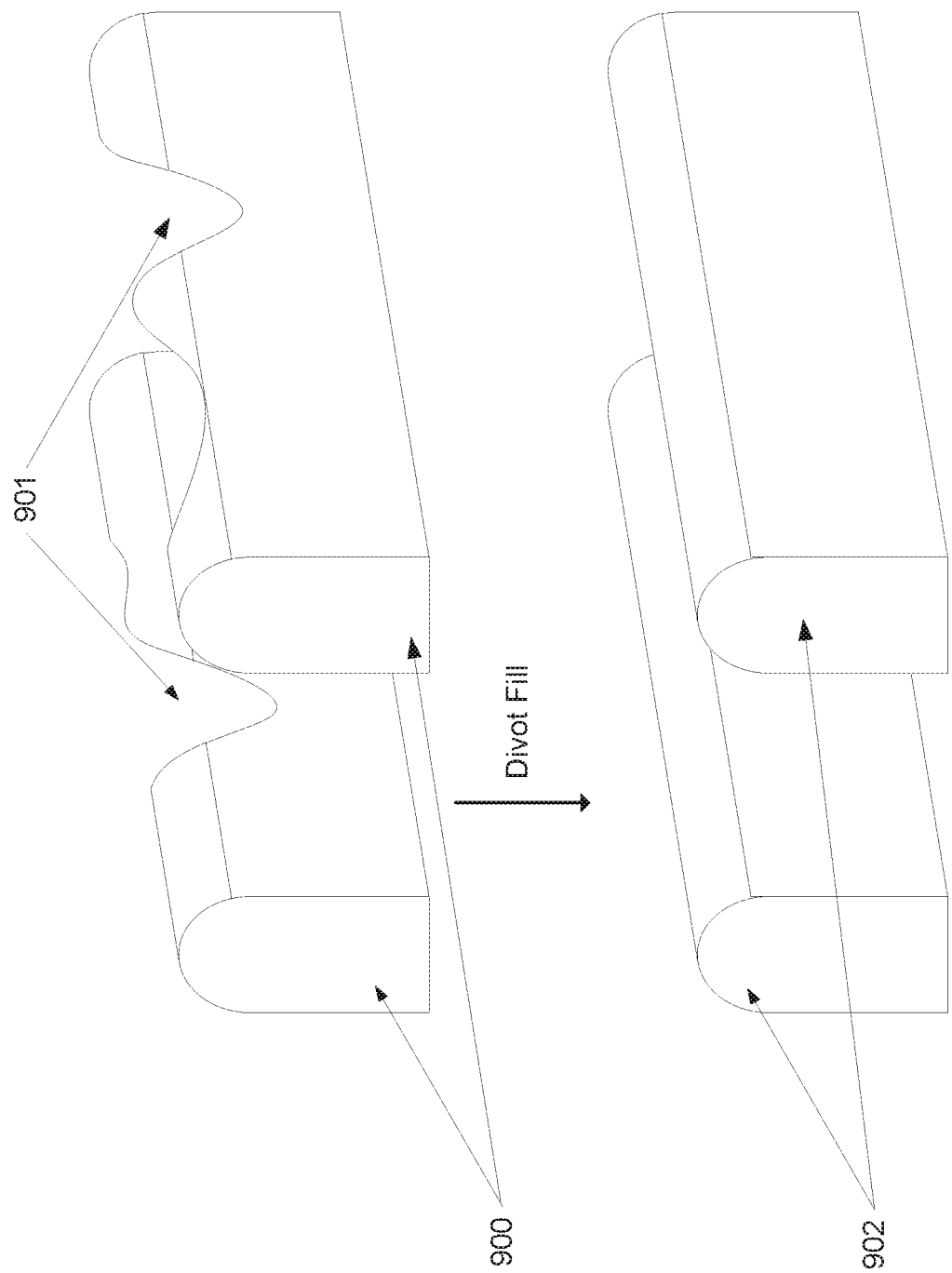

In some embodiments, operations 106-110 are cycled to fill divots in the patterned EUV resist. FIG. 9A-C show a perspective and side view of a patterned EUV resist that has had divots filled by cycled deposition and etch operations. FIG. 9A shows a perspective view of a patterned EUV resist having features, e.g. mandrels 900, with divots 901 in the mandrel 900. The divots 901 are filled by cycling deposition and etch operations, as shown in FIGS. 9B and 9C, to form mandrels 902. One of ordinary skill in the art will appreciate the mandrels 900 and 901 may comprise a multi-layer stack suitable for semiconductor processing, which may also include other layers, such as etch stop layers, cap layers, barrier layers, and other under layers.

FIG. 9B shows a side view of a mandrel during a single cycle of divot filling. In operation 910 a substrate with a patterned EUV resist 912 having divots 916 is received in a process chamber. The substrate may be in the process chamber from a previous operation or may be introduced to the process chamber. Line 914 is an imaginary line representing an ideal thickness for the EUV resist.

In operation 920 a deposition layer 922 is selectively deposited on the patterned EUV resist 912. In some embodiments more material will deposit in the divots 916 than surrounding areas of the patterned EUV resist 912. The deposition is selective to the patterned EUV resist compared to exposed portions of a layer underlying the patterned EUV resist. Process conditions for the deposition process may include any deposition process conditions discussed herein for depositing a precursor or cap layer of material.

In operation 930 the substrate is etched, forming filled divots 936 and capped EUV resist 932. Filled divots 936 are smaller than divots 916, while the capped EUV resist 932 has a similar thickness as patterned EUV resist 912. The etch process of operation 930 is selective, in that material inside of divots is etched less than material outside of divots, causing a net fill of the divots while maintaining the thickness of the EUV resist. Process conditions for the etch process depend on the deposited material, and generally material within a divot is etched less, or at a lower rate, than material in the area surrounding the divot. In some embodiments operation 930 may be accomplished by an aspect ratio dependent etch or a surface area dependent etch. In some embodiments operation 930 may be performed according to the process flow diagram of FIG. 3 as describe above. In other embodiments operation 930 may be performed according to operation 508 of FIG. 5, as described below.

FIG. 9C is a side view of a patterned EUV resist after completing four cycles of divot filling. Side profiles 942a-d show the fill of divots after successive cycles of deposition and etch, as shown in FIG. 9B. The resulting EUV profile 942d is substantially similar to the line 914 that represents an ideal thickness for the EUV resist.

Returning to FIG. 1, operations 106-110 may be cycled to fill divots of the patterned EUV resist. Operation 106 may be performed to form a halide layer on the exposed portions of the metal oxide layer. Operation 108 may be performed to deposit a silicon-containing oxide precursor on the patterned EUV resist, including inside of divots, without depositing or with less deposition on the halide layer or exposed portions of the metal oxide layer. Operation 110 may then be performed to etch the silicon-containing oxide precursor, and in some embodiments the halide layer on the exposed portions of the metal oxide layer. Thus, each cycle of operations 106-110 will result in a greater deposition inside of divots than the surrounding area. Operations 106-110 may be cycled until the patterned EUV resist has substantially no divots.

In some embodiments only operations 108 and 110 are cycled. Since the halide layer reacts with the silicon-containing precursor in operation 110, it may continue to inhibit deposition of the silicon-containing precursor in operation 108 by increasing the nucleation delay time if it has not completely reacted with the silicon-containing precursor. In such embodiments operation 106 is unnecessary to increase the selectivity of the deposition in operation 108.

In operation 112 the precursor layer of silicon-containing oxide precursor is oxidized to form a silicon oxide cap. This is done by exposing the substrate to an oxidant, i.e. an oxygen-containing gas, while igniting a plasma, which reacts with the silicon-containing oxide precursor to form a silicon oxide cap on the patterned EUV resist. The silicon oxide cap is selectively formed on top of the features of the patterned EUV resist, rather than the sidewalls, maintaining the sidewall profile of the features. Suitable oxidants include, but are not limited to: nitrous oxide ($N_2O$) gas, diols, water, oxygen, ozone, alcohols, esters, ketones, carboxylic acids, and mixtures thereof. Example process conditions for oxidizing the silicon-containing oxide precursor are 10 W-150 W, e.g. 100 W, 0V bias, process chamber temperature below 60° C., pressure between 5 mTorr and 100 mTorr, e.g. 5 mTorr, and exposure time between 5 s and 15 s, e.g. 5 s. Reactant flow may be between 100 sccm-300 sccm $O_2$. All process condition ranges are inclusive.

In operation 114 the metal oxide layer is etched, using the patterned EUV resist and the silicon oxide cap as a mask. The substrate is exposed to etching gases and a directional plasma that is selective to the metal oxide layer, i.e. the metal oxide layer is etched at a higher rate than the EUV resist or silicon oxide cap. The silicon oxide cap protects the patterned EUV resist from the etchant gas, preventing or inhibiting etching of the patterned EUV resist until the silicon oxide cap has been etched. In some embodiments the silicon oxide cap is completely removed during etching of the metal oxide layer, while in other embodiments the silicon oxide cap is not removed. Potential etching gases include halogen-containing gases. The etch selectivity for the metal oxide layer compared to the silicon oxide cap may be from about 10:1-15:1. Example process conditions for etching the metal oxide layer are power between 100 W-500 W, e.g. 300 W, 100V-300V bias, chamber temperature below 60° C., chamber pressure between 10 mTorr and 100 mTorr, e.g. 20 mTorr, and exposure time between 10 s and 30 s. Reactant flow may be between 100 sccm-300 sccm HBr and between 100 sccm-300 sccm He. All process condition ranges are inclusive.

A particular example of the method of FIG. 1 is discussed below with reference to FIG. 2. FIG. 2 presents an example embodiment of a side view of a semiconductor substrate during deposition of a cap on a patterned EUV resist during an etch process. At operation 200 a semiconductor substrate 208 having a metal oxide layer 206, carbon-containing scum 204, and patterned EUV resist features 202 is provided to a processing chamber.

At operation 210 the substrate is descummed by an ALE process using $CF_4$ to adsorb onto surfaces of the substrate, and He ions to sputter the adsorbed layer. Operation 210 may be repeated until scum 204 is sufficiently removed, performing multiple ALE cycles. The result of operation 210 is the removal of scum 204. In some embodiments operation 210 also etches the features 202 and the metal oxide layer 206, but to a much lesser extent than the scum is etched for removal.

In some embodiments, operation 210 is not performed. In some embodiments scum 204 may be insignificant enough such that a descum operation is unnecessary. In some embodiments the EUV lithography process may not create sufficient scum to warrant a descum operation. Generally, if the scum does not impact the critical dimension of the etch process, a descum operation may not be performed.

In operation 220 the exposed portions of the metal oxide layer are treated with an HBr plasma to develop a passivation layer 221. The passivation layer also forms on the open area 222, where there is a lower aspect ratio between the width of the exposed area and the height of features 202. The HBr treatment passivates the metal oxide layer, inhibiting deposition of silicon-containing precursors, such as silicon tetrachloride ($SiCl_4$).

In operation 230 a silicon-containing precursor, such as $SiCl_4$, is selectively deposited on top of features 202 to create a silicon-containing precursor layer 233. $SiCl_4$ does not deposit on the metal oxide layer 206 due to the nucleation delay time caused by passivation layer 221. $SiCl_4$ also does not substantially deposit on the sidewalls of the features.

In some embodiments the deposition time of $SiCl_4$ is sufficiently long such that a layer of $SiCl_4$ forms on the passivation layer as well. This undesired deposition may be removed prior to oxidizing the deposited $SiCl_4$ to create silicon oxide by performing an etch back operation according to the process flow diagram described in FIG. 3 above. In some embodiments operation 220, 230, and the etch back operation may be cycled to fill divots. In other embodiments only operation 230 and the etch back operation are cycled to fill divots.

In operation 240 the silicon-containing precursor layer 233 is exposed to an oxygen plasma to create a silicon oxide ($SiO_2$) cap 243. The oxygen reacts with the silicon-containing precursor layer to form an oxide. The silicon-containing precursor layer is exposed to oxygen for a variable amount of time, depending on the thickness of the silicon-containing precursor layer, to ensure it completely oxidizes.

Finally, in operation 250 the metal oxide layer is etched using an HBr plasma. Unlike the HBr plasma used in operation 220, this plasma is created with a higher energy and with a higher voltage bias in order to etch the metal oxide layer, rather than deposit a layer of HBr thereon. As the exposed portions of the metal oxide layer 206 are etched by the HBr plasma, a patterned metal oxide layer 256 is formed. Patterned metal oxide layer 256 has the same patterning as features 202 of the patterned EUV resist. The silicon oxide cap 243 is also etched to a thinner cap 253, but etches at a much lower rate than the metal oxide layer. In some embodiments the silicon oxide cap will be removed in operation 250 by the etch process.

Figure 5:
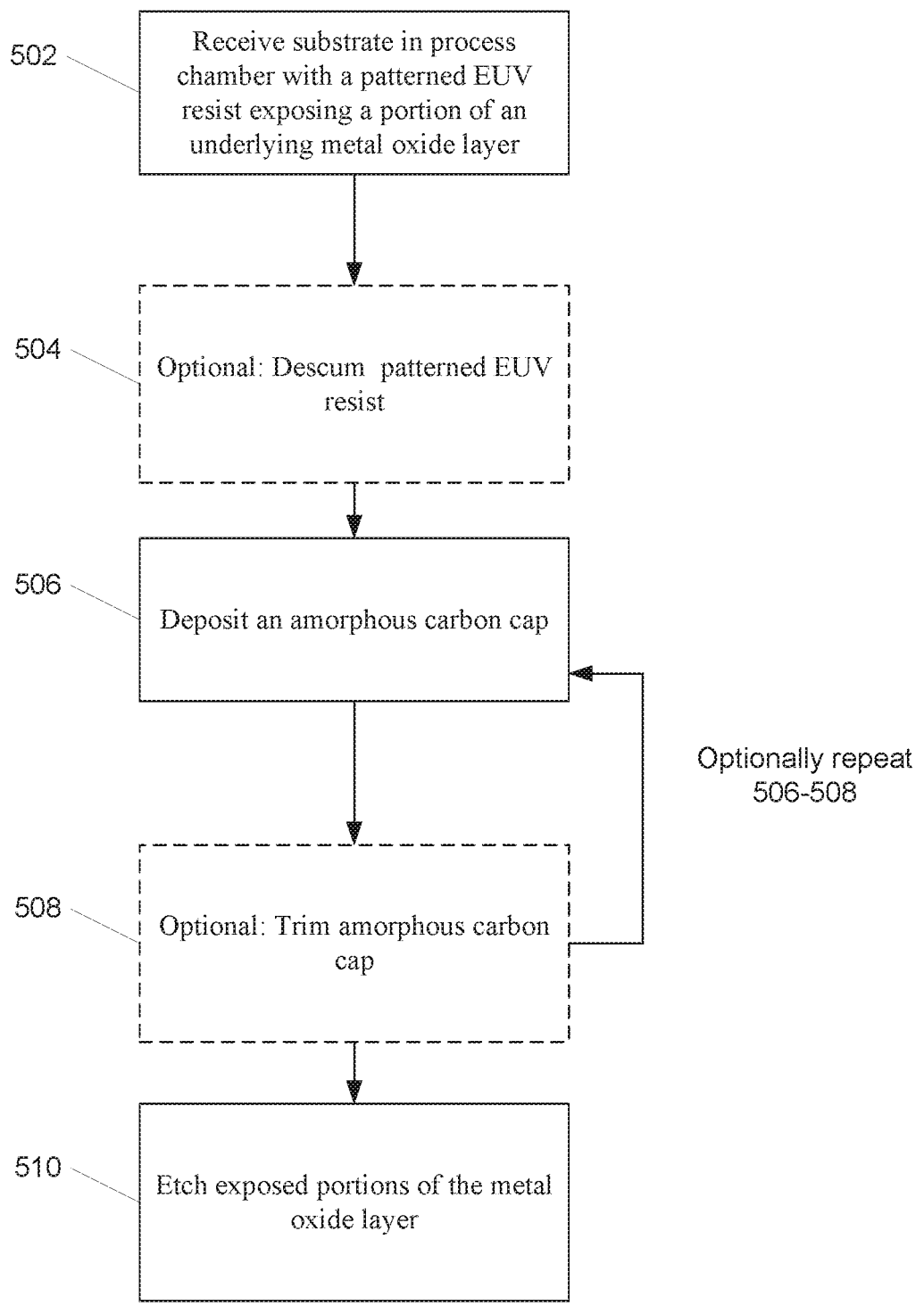
FIG. 5 presents a process flow diagram of operations for another example embodiment.

FIG. 5 provides another process flow diagram for performing operations of a method in accordance with disclosed embodiments. The method in FIG. 5 may be performed as part of another process to etch a metal oxide layer. In operation 502 a substrate with a patterned EUV resist exposing a portion of an underlying metal oxide layer is received in a process chamber. The semiconductor substrate may be in the process chamber from a previous operation or may be introduced to the process chamber.

Operation 504 is an optional operation to descum the patterned EUV resist. In some embodiments Operation 504 is performed to descum the patterned EUV resist, while in other embodiments operation 504 is not performed. Whether operation 504 is performed may depend on whether any scum on the substrate impacts the critical dimension of the patterned EUV resist. Operation 504 may be performed according to the process flow diagram of FIG. 3 as described above.

In operation 506 an amorphous carbon cap is deposited on the patterned EUV resist. A voltage bias may be applied to increase the conformality of the carbon-based deposition, though in some embodiments there will be deposition on the sidewalls of features of the patterned EUV resist. The amorphous carbon deposition may be conducted by exposing the substrate to a hydrocarbon ($C_xH_y$), such as methane ($CH_4$), a hydrogen ($H_2$) in the presence of a plasma to deposit on the features of the patterned EUV resist. H ions typically etch metal oxide layers, while carbon-based polymers, such as an EUV resist, are resistant to H ion etching. Additionally, carbon radicals in plasma will deposit on carbon-based polymers, such as an EUV resist. Thus, the hydrocarbon and $H_2$ plasma can be tuned to deposit amorphous carbon on the patterned EUV resist, while not depositing on, or nominally etching, the exposed portions of the underlying metal oxide layer.

Example process conditions for some embodiments include: single station power between 10 W-200 W, e.g. 100 W, voltage bias between 0V-100V, e.g. 60V, process chamber temperature less than 60° C., pressure between 1 mtor-100 mtorr, and exposure time between 1 s-10 s. In some embodiments the reactants are $CH_4$, with a flow rate between 10 sccm-50 sccm, e.g. 20 sccm, $H_2$, with a flow rate between 0 sccm-200 sccm, e.g. 50 sccm, and an inert gas, such as helium, with a flow rate between 200 sccm-400 sccm, e.g. 250 sccm, though other inert gases may be used. All process condition ranges are inclusive.

In some embodiments an optional operation 508 is performed to reduce or remove carbon deposited in operation 506 from the sidewalls of features of the patterned EUV resist. Operation 508 etches the substrate, removing carbon from the top and sidewalls of the patterned EUV resist. The amorphous carbon deposits more on the top of the features than the sidewalls, and thus operation 508 results in a net deposition of amorphous carbon on top of the features of the patterned EUV resist. This may be done to reduce LER or LWR or maintain feature critical dimensions. In some embodiments this operation is not performed, as any sidewall deposition is insufficient to impact feature critical dimensions.

The etch back operation 508 may proceed in an ALE manner, using the same process conditions as the descum operation discussed above with respect to FIGS. 3 and 10. In some embodiments the reactants of the descum operation (e.g., $CF_4$) are used for the etch back operation. In other embodiments, instead of a halogen-containing gas, an oxidant is adsorbed onto the surface of the carbon-containing features, which is then removed by a helium plasma. Suitable oxidants include, but are not limited to: oxygen, ozone, water, carbon dioxide ($CO_2$), nitrous oxide ($N_2O$) gas, diols, alcohols, esters, ketones, and carboxylic acids.

In some embodiments operation 506 and 508 are cycled to fill divots in the patterned EUV resist. In some embodiments operation 506 will selectively deposit within divots, i.e. more carbon will deposit within divots than areas surrounding the divots. In some embodiments operation 508 will etch within divots less than the surrounding, thicker area. By cycling operations 506 and 508, any divots may be gradually filled by the amorphous carbon precursor layer, reducing variability in the EUV resist thickness.

Finally, in operation 510 the metal oxide layer is etched, using the patterned EUV resist and the amorphous carbon cap as a mask. The amorphous carbon cap protects the patterned EUV resist from the etchant gas, preventing or inhibiting etching of the patterned EUV resist until the amorphous carbon cap has been removed. In some embodiments the amorphous carbon cap is completely removed during etching of the metal oxide layer, while in other embodiments the amorphous carbon cap is not removed. The etch selectivity for the metal oxide layer compared to the amorphous carbon cap may be from about 10:1-15:1. Example process conditions for operation 510 are the same as for operation 114 in FIG. 1, above.

Figure 6:
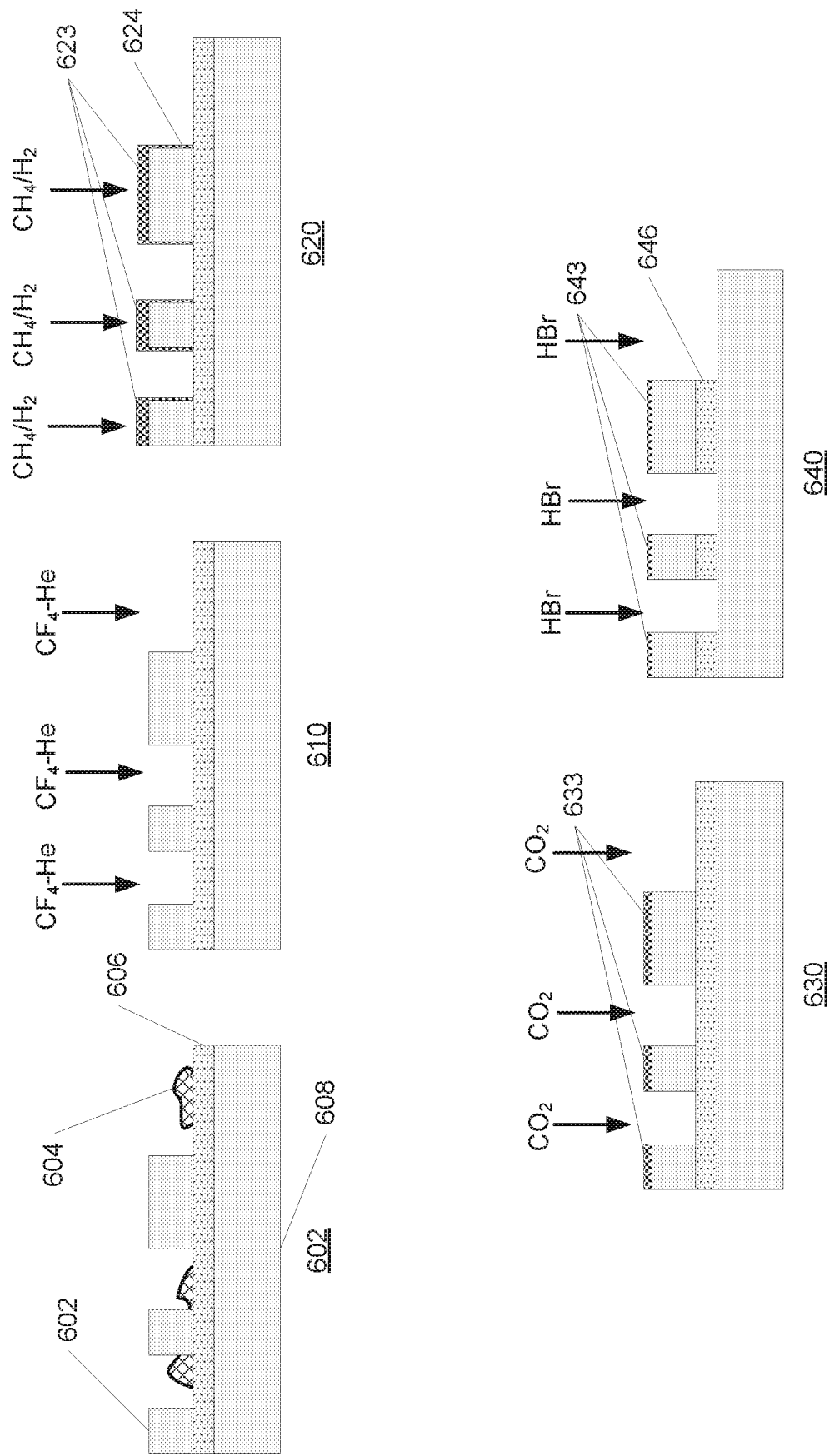
FIG. 6 presents an illustration of another example embodiment.

A particular example of the method of FIG. 5 is discussed below with reference to FIG. 6. FIG. 6 presents an example embodiment of a side view of a semiconductor substrate during deposition of a cap on a patterned EUV resist during an etch process. At operation 600 a semiconductor substrate 608 having a metal oxide layer 606, carbon-containing scum 604, and patterned EUV resist features 602 is provided to a processing chamber.

At operation 610 the substrate is descummed by an ALE process using $CF_4$ to adsorb onto surfaces of the substrate, and He ions to sputter the adsorbed layer. Operation 610 may be repeated until scum 604 is sufficiently removed, performing multiple ALE cycles. The result of operation 610 is the removal of scum 604. In some embodiments operation 610 also etches the features 602 and the metal oxide layer 606.

In some embodiments, operation 610 is not performed. In some embodiments scum 604 may be insignificant enough such that a descum operation is unnecessary. In some embodiments the EUV lithography process may not create sufficient scum to warrant a descum operation. Generally, if the scum does not impact the defect performance or critical dimension of the etch process, a descum operation may not be performed.

In operation 620 the substrate is exposed to a methane and hydrogen plasma to selectively deposit amorphous carbon on top of features 602 to form an amorphous carbon layer 623. As discussed above, the process conditions are tuned so that the carbon plasma will deposit on the features 602, while the hydrogen plasma will remove any amorphous carbon deposition on the metal oxide layer and may nominally etch the metal oxide layer. In some embodiments amorphous carbon may deposit on the sidewalls of the features 602 to form sidewall carbon 624. The carbon is deposited using a voltage bias to increase the anisotropy of the deposition, but some sidewall deposition may invariably occur.

In operation 630 the amorphous carbon precursor layer 623 and sidewall carbon 624 is etched back by an ALE process using carbon dioxide ($CO_2$) to adsorb onto carbon-containing surfaces of the substrate, then He ions to desorb the adsorbed layer and form an amorphous carbon cap 633. This operation is used to remove any carbon that deposited on the sidewalls, but also removes carbon on top of features 602. Because the carbon was selectively deposited in operation 620 such that more carbon deposited on top than on the sidewalls, the amorphous carbon cap 633 will still remain after operation 630.

In some embodiments operation 630 is not performed. In some embodiments the sidewall carbon 624 does not impact the critical dimension of the features to be etched, and this operation may be skipped in order to increase throughput. In such embodiments the carbon layer 623 is the amorphous carbon cap used in operation 640.

Finally, in operation 640 the metal oxide layer is etched using an HBr plasma. The HBr plasma is created with a high energy, and a voltage bias is applied to the semiconductor substrate, in order to etch the metal oxide layer, rather than deposit a layer of HBr thereon. As the exposed portions of the metal oxide layer 606 are etched by the HBr plasma, a patterned metal oxide layer 646 is formed. Patterned metal oxide layer 646 has the same patterning as features 602 of the patterned EUV resist. The amorphous carbon cap 633 (or amorphous carbon precursor layer 623) is also etched to a thinner cap 643, but etches at a lower rate than the metal oxide layer. In some embodiments the amorphous carbon cap is removed during operation 640 by the etch process.

Figure 7:
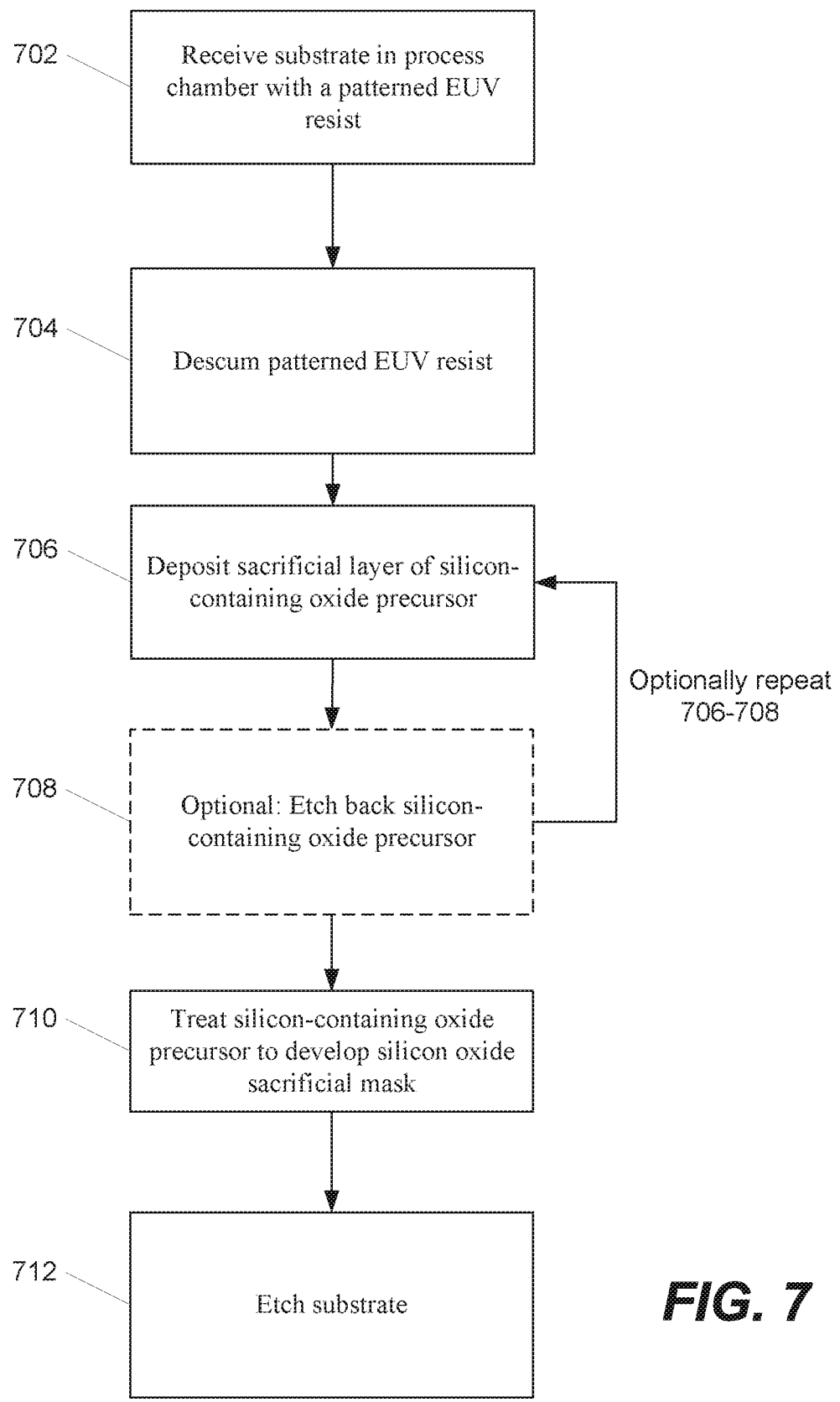
FIG. 7 presents a process flow diagram of operations for one example embodiment.

FIG. 7 provides a process flow diagram for performing operations of another method in accordance with disclosed embodiments. The method in FIG. 7 may be performed as part of a process to etch an underlying layer, which may or may not be a metal oxide layer. In operation 702 a substrate with a patterned EUV resist exposing a portion of an underlying layer is received in a process chamber. In some embodiments, features of the patterned EUV resist have an aspect ratio to the exposed portions of the underlying layer of between about 1 and about 5 or about 1 and about 2, e.g. about 1.5. The semiconductor substrate may be in the process chamber from a previous operation or may be introduced to the process chamber.

In operation 704 the patterned EUV resist is descummed in accordance with the process of FIGS. 3 and 10, as described above. In some embodiments a single ALE cycle according to FIG. 3 is performed. In other embodiments multiple ALE cycles are performed. In some embodiments operation 704 may not completely descum the patterned EUV resist. The extent to which operation 704 is performed may depend on whether any scum on the substrate impacts the critical dimension of the patterned EUV resist. In some embodiments the ALE process will also etch the underlying layer.

In operation 706 a precursor layer of silicon-containing precursor is deposited on the patterned EUV resist. The precursor is generally deposited "selectively" with respect with respect to the top of the features of the patterned EUV resist, such that more precursor deposits on top of the features than sidewalls or the exposed portions of the metal oxide layer. For example, in some embodiments there is no sidewall deposition of precursor. In some embodiments, the silicon-containing oxide precursor does not deposit on the underlying layer due to the higher aspect ratio. In embodiments where the aspect ratio is lower, silicon-containing precursor may also deposit on the underlying layer. Example process conditions for operation 706 are the same as for operation 108 for FIG. 1, above. In some embodiments the silicon-containing precursor is $SiH_4$, $Si_2H_2$, or $SiCl_4$.

In some embodiments an optional operation 708 is performed where the patterned EUV resist and the precursor layer are etched according to the process of FIG. 3. The ALE process may remove additional scum that was not removed in operation 704 above, as well as portions of the underlying layer and portions of the precursor layer. In some embodiments multiple ALE cycles are performed to remove scum or other non-desirable deposition on the underlying layer while the precursor layer protects the features of the EUV resist.

In some embodiments operation 706 and 708 are cycled to fill divots in the patterned EUV resist. In some embodiments more silicon-containing precursor will deposit within divots than areas surrounding the divots in operation 706, likely due to the divots having a greater surface area relative to the flatter surrounding field. In some embodiments, operation 708 will etch within divots less than the surrounding, thicker area. By cycling operations 706 and 708, any divots may be gradually filled by the silicon-containing precursor layer, reducing variability in the EUV resist thickness.

In operation 710 the precursor layer of silicon containing precursor is oxidized to form a silicon oxide cap. This is done by exposing the substrate to an oxidant, i.e. an oxygen-containing gas, while igniting a plasma, which reacts with the silicon-containing precursor to form a silicon oxide cap on the patterned EUV resist. The silicon oxide cap is selectively formed on top of the features of the patterned EUV resist, rather than the sidewalls, maintaining the sidewall profile of the features. Suitable oxidants and process conditions for operation 840 are the same as operation 112, above.

In operation 712 the underlying layer is etched, using the patterned EUV resist and the silicon oxide cap. The silicon oxide cap protects the patterned EUV resist from the etchant gas, preventing or inhibiting etching of the patterned EUV resist until the silicon oxide cap has been etched. In some embodiments the silicon oxide cap is completely removed during etching of the underlying layer, while in other embodiments the silicon oxide cap is not removed. Example process conditions for operation 712 may be the same as for operation 114 in FIG. 1, above. In some embodiments different etch chemistries may be used, so long as there is sufficient etch selectivity between the underlying layer and the combination of the patterned EUV resist and silicon oxide cap that the underlying layer can be etched using the combination as a mask. The particular etch chemistry to be used depends on the materials comprising the underlying layer.

Figure 8:
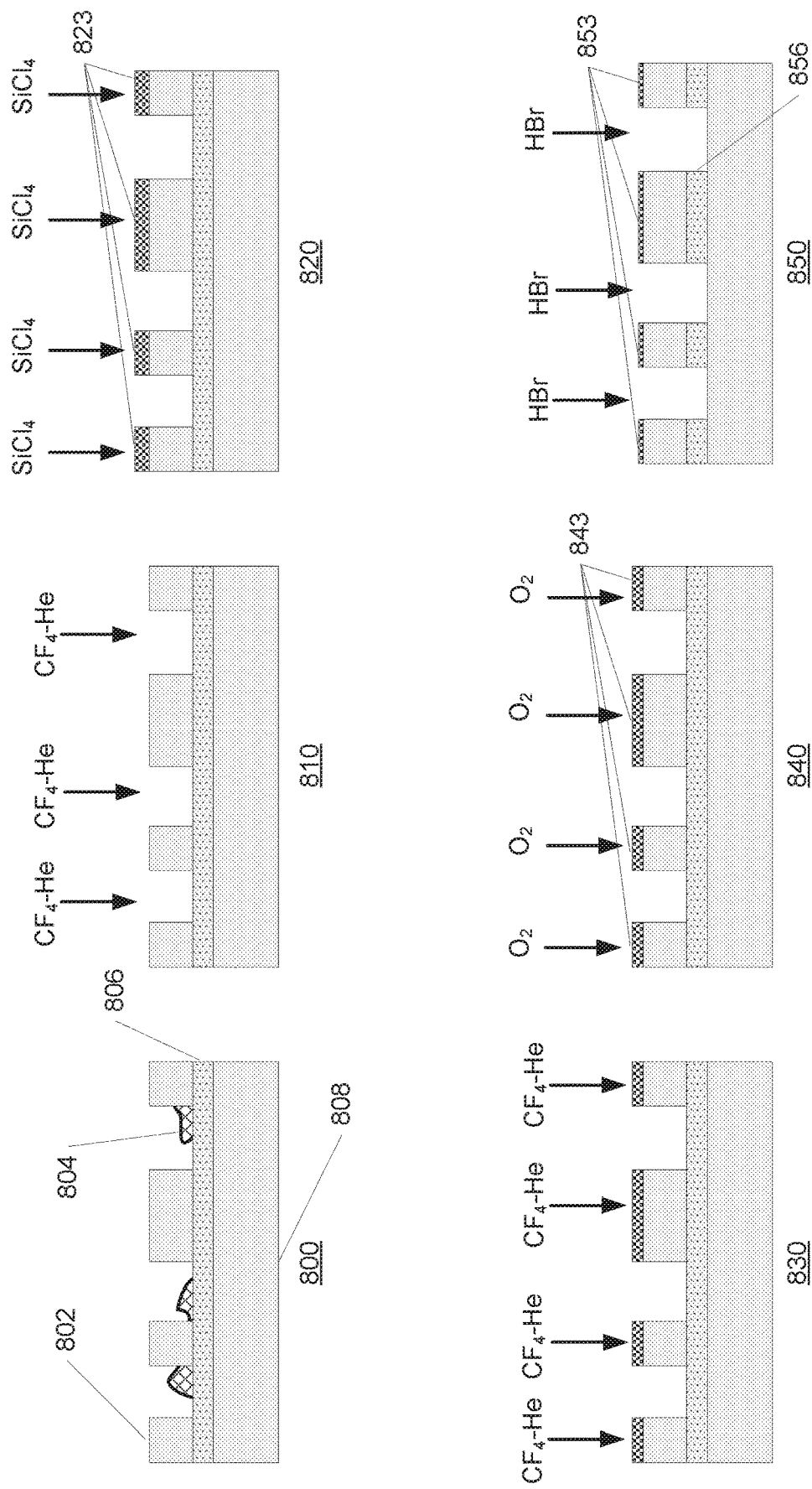
FIG. 8 presents an illustration of another example embodiment.

A particular example of the method of FIG. 7 is discussed below with reference to FIG. 8. FIG. 8 presents an example embodiment of a side view of a semiconductor substrate during capping of a patterned EUV resist during an etch process. At operation 800 a semiconductor substrate 808 having a metal oxide layer 806, carbon-containing scum 804, and patterned EUV resist features 802 is provided to a processing chamber.

At operation 810 the substrate is descummed by an ALE process using $CF_4$ to adsorb onto surfaces of the substrate, and He ions to sputter the adsorbed layer. Operation 810 may be repeated until scum 804 is sufficiently removed, performing multiple ALE cycles. The result of operation 810 is the removal of scum 804. In some embodiments operation 810 also etches the features 802 and the underlying layer 806. Operation 810 may be performed using the same process conditions as presented by FIG. 3, above.

In some embodiments, operation 810 is not performed. In some embodiments scum 804 may be insignificant enough such that a descum operation is unnecessary. In some embodiments the EUV lithography process may not create sufficient scum to impact the critical dimension of the patterned EUV resist. Generally, if the scum does not impact the critical dimension of the etch process, a descum operation may not be performed.

In operation 820 $SiCl_4$ is selectively deposited on top of features 802 to create a silicon-containing precursor layer 823. $SiCl_4$ does not deposit, or deposits less, on the underlying layer 806 due to the aspect ratio of the patterned EUV resist and the exposed portions of the underlying layer. $SiCl_4$ also does not deposit on the sidewalls of the features, depositing entirely or mostly on top of features 802.

In operation 830 the silicon-containing precursor layer is etched using an ALE process with $CF_4$ to adsorb onto surfaces of the silicon-containing precursor layer, and He ions to desorb the adsorbed layer. This may be done to remove a portion of the silicon-containing precursor layer. In some embodiments this may be advantageous to reduce the aspect ratio of the patterned EUV resist or maintain the critical dimension of features of the patterned EUV resist. In some embodiments $SiCl_4$ deposits on the exposed portions of the underlying layer during operation 820, and operation 830 removes this deposition.

In some embodiments operation 830 is not performed. In some embodiments the $SiCl_4$ does not sufficiently deposit on the exposed portions of the underlying layer to require an etch operation.

In some embodiments operation 820 and 830 are cycled to fill divots in the EUV resist. Operation 830 will etch areas with greater surface areas more than areas with less surface area, thereby etching within divots less than the surrounding area. By cycling operations 820 and 830, any divots may be gradually filled by the silicon-containing precursor layer 833, reducing variability in the EUV resist thickness.

In operation 840 the silicon-containing precursor layer 823 is oxidized to create a silicon oxide cap 843. This is done by exposing the substrate to an oxidant, i.e. an oxygen-containing gas, while igniting a plasma, which reacts with the silicon-containing precursor to form a silicon oxide cap on the patterned EUV resist. The silicon oxide cap is selectively formed on top of the features of the patterned EUV resist, rather than the sidewalls, maintaining the sidewall profile of the features.

Finally, in operation 850 the underlying layer is etched using an HBr plasma. As the exposed portions of the underlying layer 806 are etched by the HBr plasma, a patterned underlying layer 856 is formed. Patterned underlying layer 856 has the same patterning as features 802 of the patterned EUV resist. The silicon oxide cap 843 is also etched to a thinner cap 853, but etches at a lower rate than the underlying layer. In some embodiments the silicon oxide cap is completely removed during etching of the underlying layer, while in other embodiments the silicon oxide cap is not removed.

Deposition Materials

Deposition of a precursor layer or cap may be a plasma deposition including a plasma-enhanced chemical vapor deposition (PECVD) process or a high-density plasma chemical vapor deposition (HDP-CVD) process according to various embodiments. In embodiments in which the etch process is performed in a capacitively-coupled plasma etching apparatus, a PECVD process may be advantageously performed, and in embodiments in which the etch process is performed in an inductively-coupled plasma etching apparatus, an HDP-CVD process may be advantageously performed.

In depositing a silicon-containing oxide precursor, any appropriate silicon-containing precursor may be used including silanes (e.g., $SiH_4$), polysilanes ($H_3Si$—$(SiH_2)_n$—$SiH_3$) where n≥1, organosilanes, halogenated silanes, and aminosilanes. Organosilanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like, may be used. A halogenated silane contains at least one halogen group and may or may not contain hydrogens and/or carbon groups. Examples of halogenated silanes are iodosilanes, bromosilanes, chlorosilanes and fluorosilanes. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chioroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2Si(NH_2)$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)$—$(N(CH_3)_2)_2$, $SiHCl$—$(N(CH_3)_2)_2$, $(Si(CH_3)_2NH)_3$ and the like.

The deposited films may be amorphous, with film composition depending on the particular precursor and co-reactants used, with organosilanes resulting a-SiC:H films and aminosilanes resulting in a-SiN:H or a-SiCN:H films.

In depositing carbon-based films, a hydrocarbon precursor of the formula $C_xH_y$, wherein X is an integer between 2 and 10, and Y is an integer between 2 and 24, may be used. Examples include methane ($CH_4$), acetylene ($C_2H_2$), ethylene ($C_2H_4$), propylene ($C_3H_6$), butane ($C_4H_{10}$), cyclohexane ($C_6H_{12}$), benzene ($C_6H_6$), and toluene ($C_7H_8$).

In some embodiments, the cap may be doped or include a material such as boron or phosphorous. Additional dopants include arsenic, sulfur and selenium. In this manner, etch selectivity to a mask or cap layer may be improved. For example, for doped dielectrics (particularly silicon dioxide-based dielectrics), the process gas may include a dopant precursor such as a boron-containing gas, a phosphorus-containing gas, a carbon-containing gas, or a mixture thereof. In a specific embodiment, the gas includes one or more boron-containing reactants and one or more phosphorus-containing reactants and the dielectric film includes a phosphorus- and boron-doped silicon oxide glass (BPSG). Examples of suitable boron and phosphorus precursor gases include borane ($BH_3$), diborane ($B_2H_6$), and triborane ($B_3H_7$) and phosphine ($PH_3$). Examples of arsenic-containing, sulfur-containing, and selenium-containing gases include hydrogen selenide ($H_2Se$), hydrogen arsenide ($AsH_3$), and hydrogen sulfide ($H_2S$).

If the cap is to contain an oxynitride (e.g., silicon oxynitride), then the deposition gas may include a nitrogen-containing reactant such as $N_2$, $NH_3$, NO, $N_2O$, and mixtures thereof. Examples of deposited films include boron-doped silicon, silicon boride, silicon boride carbon, and the like.

Apparatus

FIG. 11 schematically shows a cross-sectional view of an inductively coupled plasma etching apparatus 1100 in accordance with certain embodiments herein. A Kiyo™ reactor, produced by Lam Research Corp. of Fremont, CA, is an example of a suitable reactor that may be used to implement the techniques described herein. The inductively coupled plasma etching apparatus 1100 includes an overall etching chamber structurally defined by chamber walls 1101 and a window 1111. The chamber walls 1101 may be fabricated from stainless steel or aluminum. The window 1111 may be fabricated from quartz or other dielectric material. An optional internal plasma grid 1150 divides the overall etching chamber into an upper sub-chamber 1102 and a lower sub-chamber 1103. In most embodiments, plasma grid 1150 may be removed, thereby utilizing a chamber space made of sub-chambers 1102 and 1103. A chuck 1117 is positioned within the lower sub-chamber 1103 near the bottom inner surface. The chuck 1117 is configured to receive and hold a semiconductor wafer 1119 upon which the etching process is performed. The chuck 1117 can be an electrostatic chuck for supporting the wafer 1119 when present. In some embodiments, an edge ring (not shown) surrounds chuck 1117, and has an upper surface that is approximately planar with a top surface of a wafer 1119, when present over chuck 1117. The chuck 1117 also includes electrostatic electrodes for chucking and dechucking the wafer. A filter and DC clamp power supply (not shown) may be provided for this purpose. Other control systems for lifting the wafer 1119 off the chuck 1117 can also be provided. The chuck 1117 can be electrically charged using an RF power supply 1123. The RF power supply 1123 is connected to matching circuitry 1121 through a connection 1127. The matching circuitry 1121 is connected to the chuck 1117 through a connection 1125. In this manner, the RF power supply 1123 is connected to the chuck 1117.

A coil 1133 is positioned above window 1111. The coil 1133 is fabricated from an electrically conductive material and includes at least one complete turn. The exemplary coil 1133 shown in FIG. 11 includes three turns. The cross-sections of coil 1133 are shown with symbols, and coils having an "X" extend rotationally into the page, while coils having a "•" extend rotationally out of the page. An RF power supply 1141 is configured to supply RF power to the coil 1133. In general, the RF power supply 1141 is connected to matching circuitry 1139 through a connection 1145. The matching circuitry 1139 is connected to the coil 1133 through a connection 1143. In this manner, the RF power supply 1141 is connected to the coil 1133. An optional Faraday shield 1149 is positioned between the coil 1133 and the window 1111. The Faraday shield 1149 is maintained in a spaced apart relationship relative to the coil 1133. The Faraday shield 1149 is disposed immediately above the window 1111. The coil 1133, the Faraday shield 1149, and the window 1111 are each configured to be substantially parallel to one another. The Faraday shield may prevent metal or other species from depositing on the dielectric window of the plasma chamber.

Process gases may be supplied through a main injection port 1160 positioned in the upper chamber and/or through a side injection port 1170, sometimes referred to as an STG. A vacuum pump, e.g., a one or two stage mechanical dry pump and/or turbomolecular pump 1140, may be used to draw process gases out of the process chamber 1124 and to maintain a pressure within the process chamber 1100 by using a closed-loop-controlled flow restriction device, such as a throttle valve (not shown) or a pendulum valve (not shown), during operational plasma processing.

During operation of the apparatus, one or more reactant gases may be supplied through injection ports 1160 and/or 1170. In certain embodiments, gas may be supplied only through the main injection port 1160, or only through the side injection port 1170. In some cases, the injection ports may be replaced by showerheads. The Faraday shield 1149 and/or optional grid 1150 may include internal channels and holes that allow delivery of process gases to the chamber. Either or both of Faraday shield 1149 and optional grid 1150 may serve as a showerhead for delivery of process gases.

Radio frequency power is supplied from the RF power supply 1141 to the coil 1133 to cause an RF current to flow through the coil 1133. The RF current flowing through the coil 1133 generates an electromagnetic field about the coil 1133. The electromagnetic field generates an inductive current within the upper sub-chamber 1102. During an etch process, the physical and chemical interactions of various generated ions and radicals with the wafer 1119 selectively etch features of the wafer.

If the plasma grid is used such that there is both an upper sub-chamber 1102 and a lower sub-chamber 1103, the inductive current acts on the gas present in the upper sub-chamber 1102 to generate an electron-ion plasma in the upper sub-chamber 1102. The optional internal plasma grid 1150 limits the amount of hot electrons in the lower sub-chamber 1103. In some embodiments, the apparatus is designed and operated such that the plasma present in the lower sub-chamber 1103 is an ion-ion plasma.

Both the upper electron-ion plasma and the lower ion-ion plasma may contain positive and negative ions, through the ion-ion plasma will have a greater ratio of negative ions to positive ions. Volatile etching byproducts may be removed from the lower-subchamber 1103 through port 1122.

The chuck 1117 disclosed herein may operate at elevated temperatures ranging between about 30° C. and about 250° C. The temperature will depend on the etching process operation and specific recipe. In some embodiments, the chamber 1101 may also operate at pressures in the range of between about 1 mTorr and about 95 mTorr. In certain embodiments, the pressure may be higher as disclosed above.

Chamber 1101 may be coupled to facilities (not shown) when installed in a clean room or a fabrication facility. Facilities include plumbing that provide processing gases, vacuum, temperature control, and environmental particle control. These facilities are coupled to chamber 1101, when installed in the target fabrication facility. Additionally, chamber 1101 may be coupled to a transfer chamber that allows robotics to transfer semiconductor wafers into and out of chamber 1101 using typical automation.

In some embodiments, a system controller 1130 (which may include one or more physical or logical controllers) controls some or all of the operations of an etching chamber. Controllers are described further below.

FIG. 12 is a schematic depiction of an example of a capacitively-coupled plasma etching apparatus according to various embodiments. A plasma etch chamber 1200 includes an upper electrode 1202 and a lower electrode 1204 between which a plasma may be generated. A substrate 1299 having a patterned EUV resist thereon and as described above may be positioned on the lower electrode 1204 and may be held in place by an electrostatic chuck (ESC). Other clamping mechanisms may also be employed. The plasma etch chamber 1200 may include plasma confinement rings 1206 that keep the plasma over the substrate and away from the chamber walls. Other plasma confinement structures, e.g. as a shroud that acts an inner wall, may be employed. In some embodiments, the plasma etch chamber may not include any such plasma confinement structures.

In the example of FIG. 12, the plasma etch chamber 1200 includes two RF sources with RF source 1210 connected to the upper electrode 1202 and RF source 1212 connected to the lower electrode 1204. Each of the RF sources 1210 and 1212 may include one or more sources of any appropriate frequency including 2 MHz, 13.56 MHz, 27 MHz, and 60 MHz. Gas may be introduced to the chamber from one or more gas sources 1214, 1216, and 1218. For example, the gas source 1214 may include deposition or etching gases as described above. Gas may be introduced to the chamber through inlet 1220 with excess gas and reaction byproducts exhausted via exhaust pump 1222.

One example of a plasma etch chamber that may be employed is a 2300@ Flex™ reactive ion etch tool available from Lam Research Corp. of Fremont, CA Further description of plasma etch chambers may be found in U.S. Pat. Nos. 6,841,943 and 8,552,334, which are herein incorporated by reference for all purposes.

Returning to FIG. 12, a controller 1130 may be connected to the RF sources 1210 and 1212 as well as to valves associated with the gas sources 1214, 1216, and 1218, and to the exhaust pump 1222. In some embodiments, the controller 1130 controls all of the activities of the plasma etch chamber 1200.

The following discussion of a controller 1130 may be applied as appropriate to the controller 1130 in FIGS. 11 and 12. The controller 1130 may execute control software stored in mass storage device, loaded into a memory device, and executed on a processor. Alternatively, the control logic may be hard coded in the controller 1130. Alternatively, the control logic may be hard coded in the controller 1130. Applications Specific Integrated Circuits, Programmable Logic Devices (e.g., field-programmable gate arrays, or FPGAs) and the like may be used for these purposes. In the following discussion as well as in the discussion of the controller in FIG. 6, wherever "software" or "code" is used, functionally comparable hard coded logic may be used in its place.

The control software may include instructions for controlling the timing of application and/or magnitude of any one or more of the following chamber operational conditions: the mixture and/or composition of gases, chamber pressure, chamber temperature, wafer/wafer support temperature, the bias applied to the wafer, the frequency and power applied to coils or other plasma generation components, wafer position, wafer movement speed, and other parameters of a particular process performed by the tool. For example, the control software may include instructions to flow the reactants discussed above, such as silicon-containing precursors, halogen-containing gases, oxidants, or inert gases. Control software may be configured in any suitable way. For example, various process tool component subroutines or control objects may be written to control operations of the process tool components necessary to carry out various process tool processes. Control software may be coded in any suitable compute readable programming language.

In some embodiments, the control software may include input/output control (IOC) sequencing instructions for controlling the various parameters described above. Other computer software and/or programs stored on mass storage device and/or memory device associated with the controller 1130 may be employed in some embodiments. Examples of programs or sections of programs for this purpose include a process gas control program, a pressure control program, and RF source control programs.

A process gas control program may include code for controlling gas composition (e.g., deposition and treatment gases as described herein) and flow rates and optionally for flowing gas into a chamber prior to deposition to stabilize the pressure in the chamber. A pressure control program may include code for controlling the pressure in the chamber by regulating, for example, a throttle valve in the exhaust system of the chamber, a gas flow into the chamber, etc. A RF source control program may include code for setting RF power levels applied to the electrodes in accordance with the embodiments herein.

In some embodiments, there may be a user interface associated with the controller 1130. The user interface may include a display screen, graphical software displays of the apparatus and/or process conditions, and user input devices such as pointing devices, keyboards, touch screens, microphones, etc.

In some embodiments, parameters adjusted by controller 1130 may relate to process conditions. Non-limiting examples include process gas composition and flow rates, temperature, pressure, plasma conditions (such as RF bias power levels), pressure, temperature, etc. These parameters may be provided to the user in the form of a recipe, which may be entered utilizing the user interface. There parameters may be in a similar form as the process conditions provided herein.

Signals for monitoring the process may be provided by analog and/or digital input connections of system controller 1130 from various process tool sensors. The signals for controlling the process may be output on the analog and digital output connections of the plasma etch chamber. Non-limiting examples of sensors that may be monitored include mass flow controllers, pressure sensors (such as manometers), thermocouples, etc. Appropriately programmed feedback and control algorithms may be used with data from these sensors to maintain process conditions.

The controller 1130 may provide program instructions for implementing the above-described directional deposition processes as well as subsequent etch processes. The program instructions may control a variety of process parameters, such as RF bias power level, pressure, temperature, etc. The instructions may control the parameters to directionally deposit cap-build up films according to various embodiments described herein. For example, the instructions may control the flow rate of silicon-containing oxide precursors, or the power of halogen-containing plasma.

A controller 1130 will typically include one or more memory devices and one or more processors configured to execute the instructions so that the apparatus will perform a method in accordance with disclosed embodiments. Machine-readable media including instructions for controlling process operations in accordance with disclosed embodiments may be coupled to the controller 1130, for example as describe above.

In some implementations, the controller 1130 may be or form part of a system controller that is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The system controller, depending on the processing conditions and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the system controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the system controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The system controller, in some implementations, may be a part of or coupled to a computer that is integrated with, coupled to the system, otherwise networked to the system, or a combination thereof. For example, the system controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the system controller receives instructions in the form of data, which specify parameters for each of the processing steps to be performed during one or more operations. It should be understood that the parameters may be specific to the type of process to be performed and the type of tool that the system controller is configured to interface with or control. Thus as described above, the system controller may be distributed, such as by including one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

In some embodiments, the PECVD deposition may employ a remote, radical-assisted plasma or a microwave plasma. Such a deposition may be performed in an etch chamber configured with a remote or microwave plasma generator or may be performed in a deposition chamber connected under vacuum to an etch chamber. Similarly, in some embodiments, a treatment operation may be performed using a remote radical-assisted plasma or a microwave plasma.

Example process parameters are given as follows. Example pressure ranges are from 5 mT to 1000 mT, and in some embodiments, between 40 mT to 100 mT. In a treatment operation, example pressures may range from 5 mT to 300 mT.

Example plasma powers for an inductively coupled plasma source (e.g., a transformer coupled plasma (TCP) source available from Lam Research, Fremont California is 10 W to 1200 W, 20 W to 500 W, or 50 W to 300 W. Example plasma powers for a deposition operation range from 20 W to 200 W. Example plasma powers for a treatment operation range from 20 W to 1200 W.

Example bias voltages range from 0 V to −500 V, 0 to −80 V, for example −50 V. Bias voltage may also be expressed in terms of magnitude, e.g., 0 to 500 V, 0 to 80 V, or 0 to 50 V. Example flow rates at the deposition step range from 1 sccm to 2000 sccm, from 1 to 300 sccm, or 100 sccm. Example flow rates at the treatment step range from 1 to 2000 sccm, 1 to 500 sccm, or 300 sccm. Example substrate temperatures range from 40° C. to 2500 or 60° C. to 120° C. Deposition and treatment exposure time may range from 0.5 s to 20 s in some embodiments, or from 3 s to 10 s, or 4 s to 6 s, with an example of a process time for the multi-cycle process. In some examples, between 10 and 100 cycles are performed.

Conclusion

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

The invention claimed is:

1. A method, comprising:
   providing to a processing chamber a semiconductor substrate comprising a patterned EUV resist exposing a portion of an underlying metal oxide layer;
   treating the exposed portion of the metal oxide layer with a halogen-containing plasma;
   selectively depositing a silicon-containing precursor on carbon-containing features of the patterned EUV resist; and
   treating the silicon-containing precursor to convert the silicon-containing precursor to a silicon oxide cap on the carbon-containing features of the patterned EUV resist.

2. The method of claim 1, wherein treating the exposed portion of the metal oxide layer with a halogen-containing plasma is performed with a voltage bias between 0V and 100V, inclusive.

3. The method of claim 1, wherein the halogen-containing plasma comprises a hydrogen halide.

4. The method of claim 3, wherein the halogen-containing plasma comprises HBr.

5. The method of claim 1, wherein the silicon-containing precursor is selective to the carbon containing features compared to the metal oxide layer treated with the halogen-containing plasma at a ratio greater than about 10:1.

6. The method of claim 1, further comprising etching the underlying metal oxide layer using the silicon oxide cap and patterned EUV resist as a mask.

7. The method of claim 1, wherein the silicon-containing precursor comprises one or more of $SiH_4$, $Si_2H_2$, or $SiCl_4$.

8. The method of claim 1, wherein treating the silicon-containing precursor uses an oxygen-containing reactant.

9. The method of claim 8, wherein the oxygen-containing reactant is chosen from the group of $H_2O$, $NO$, $N_2O$, $CO_2$, $O_2$, or $O_3$.

10. The method of claim 1, further comprising, prior to treating the metal oxide layer with a halogen-containing plasma, removing non-desirable carbon material (scum) from carbon containing features of the patterned EUV resist using an atomic layer etch (ALE) process comprising:
    exposing the patterned EUV resist to a halogen-containing gas to modify the scum on a surface of the carbon-containing features; and
    exposing the modified scum on the surface of the patterned EUV resist to a plasma of an inert gas to remove the modified scum.

11. The method of claim 10, wherein the halogen-containing gas comprises one or more of a halogen gas and a halide gas.

12. The method of claim 11, wherein the halogen gas is $Cl_2$ or $Br_2$.

13. The method of claim 11, wherein the halide gas is $CF_4$ or HBr.

14. The method of claim 10, wherein the inert gas comprises helium, neon, argon, or xenon.

15. The method of claim 10, wherein exposing the modified scum on the surface of the patterned EUV resist to a plasma is performed at a voltage bias between 0V and 100V in a continuous mode or 100V to 400V in a pulsing mode, inclusive.

16. The method of claim 1, further comprising:
after selectively depositing a silicon-containing precursor, modifying a surface layer of the precursor, and exposing the semiconductor substrate to a plasma of an inert gas to remove the modified layer of the precursor by atomic layer etch (ALE).

17. The method of claim 16, further comprising repeating the selective deposition and ALE operations to fill divots on carbon-containing features of the patterned EUV resist.

18. The method of claim 10, further comprising etching the metal oxide layer using the silicon oxide cap and patterned EUV resist as a mask.

19. A method, comprising:
providing to a processing chamber a semiconductor substrate comprising a patterned EUV resist exposing a portion of an underlying metal oxide layer; and
selectively depositing an amorphous carbon cap on carbon-containing features of the patterned EUV resist by exposing the semiconductor substrate to a gas mixture comprising hydrocarbon, hydrogen, and inert gas in the presence of a plasma, wherein depositing the amorphous carbon cap does not occur on the portion of the underlying metal oxide layer.

20. The method of claim 19, wherein the hydrocarbon is $CH_4$ or $C_2H_2$.

21. The method of claim 19, wherein the inert gas comprises helium, neon, argon, or xenon.

22. The method of claim 19, further comprising, prior to selectively depositing an amorphous carbon cap, removing non-desirable carbon material (scum) from carbon containing features of the patterned EUV resist using an atomic layer etch (ALE) process comprising:
exposing the patterned EUV resist to a halogen-containing gas to modify the scum on a surface of the carbon-containing features; and
exposing the modified scum on the surface of the patterned EUV resist to a plasma of an inert gas.

23. The method of claim 22, wherein the halogen-containing gas comprises one or more of a halogen gas and a halide gas.

24. The method of claim 23, wherein the halogen gas is $Cl_2$, or $Br_2$.

25. The method of claim 23, wherein the halide gas is $CF_4$ or HBr.

26. The method of claim 22, wherein the inert gas comprises helium, neon, argon, or xenon.

27. The method of claim 22, wherein exposing the modified scum on the surface of the patterned EUV resist to a plasma is performed at a voltage bias between 0V and 100V in a continuous mode or 100V to 400V in a pulsing mode, inclusive.

28. The method of claim 19, further comprising etching the deposited amorphous carbon cap on the carbon-containing features of the patterned EUV resist.

29. The method of claim 28, wherein etching the deposited amorphous carbon cap comprises:
exposing the amorphous carbon cap to an oxygen-containing reactant to modify the amorphous carbon; and
exposing the modified amorphous carbon to a plasma of an inert gas.

30. The method of claim 29, wherein the oxygen-containing reactant is $O_2$, $O_3$, $H_2O$, $N_2O$, NO, or $CO_2$.

31. The method of claim 28, further comprising repeating the selective deposition and etching the deposited amorphous carbon cap to fill divots on carbon-containing features of the patterned EUV resist.

32. The method of claim 19, further comprising etching the underlying metal oxide layer using the amorphous carbon cap and patterned EUV resist as a mask.

* * * * *